US010108304B2

(12) United States Patent
Satou

(10) Patent No.: US 10,108,304 B2
(45) Date of Patent: Oct. 23, 2018

(54) CONDUCTIVE FILM, CONDUCTIVE FILM MANUFACTURING METHOD, AND TOUCH PANEL

(71) Applicant: FUJIFILM Corporation, Tokyo (JP)

(72) Inventor: Tasuku Satou, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 135 days.

(21) Appl. No.: 15/234,845

(22) Filed: Aug. 11, 2016

(65) Prior Publication Data

US 2016/0349884 A1 Dec. 1, 2016

Related U.S. Application Data

(63) Continuation of application No. PCT/JP2014/078883, filed on Oct. 30, 2014.

(30) Foreign Application Priority Data

Mar. 28, 2014 (JP) .................................. 2014-069553

(51) Int. Cl.
*G06F 3/044* (2006.01)
*H05K 3/12* (2006.01)
(Continued)

(52) U.S. Cl.
CPC .............. *G06F 3/044* (2013.01); *H05K 1/092* (2013.01); *H05K 3/0058* (2013.01); *H05K 3/04* (2013.01);
(Continued)

(58) Field of Classification Search
CPC ........... G06F 2203/04112; G06F 3/044; G06F 2203/04103; H05K 1/092;
(Continued)

(56) References Cited

U.S. PATENT DOCUMENTS 9,198,285 B2 * 11/2015 Zhou .................... H05K 1/0296
2014/0134328 A1 5/2014 Choi et al.

FOREIGN PATENT DOCUMENTS

EP 2827231 A2 * 1/2015 ........... H05K 1/0274
EP 2824546 A4 * 3/2016 ............. G06F 3/041
(Continued)

OTHER PUBLICATIONS

English translation of the Written Opinion of the International Searching Authority (form PCT/ISA/237), dated Jan. 20. 2015, for International Application No. PCT/JP2014/078883.
(Continued)

*Primary Examiner* — Tony Davis
(74) *Attorney, Agent, or Firm* — Birch, Stewart, Kolasch & Birch, LLP

(57) ABSTRACT

An object of the invention is to provide a conductive film that can prevent an operation error caused by ion migration and is suitable for, for example, a projected capacitive touch panel, a method for manufacturing the conductive film, and a touch panel using the conductive film. In the conductive film, a resin layer is laminated on a surface of a substrate. A mesh-shaped groove portion is formed in a surface of the resin layer. A thin metal wire is provided in the groove portion to form an electrode pattern. When a value indicating ion migration characteristics of the electrode pattern in a longitudinal direction is ML and a value indicating ion migration characteristics of the electrode pattern in a lateral direction is MS, a migration ratio obtained by dividing the larger of the two values ML and MS by the smaller value is in the range of 1.0 to 1.4.

20 Claims, 17 Drawing Sheets

(51) Int. Cl.
*H05K 1/09* (2006.01)
*H05K 3/00* (2006.01)
*H05K 3/04* (2006.01)

(52) U.S. Cl.
CPC . *H05K 3/1258* (2013.01); *G06F 2203/04103* (2013.01); *G06F 2203/04112* (2013.01); *H05K 2201/0769* (2013.01); *H05K 2201/09045* (2013.01); *H05K 2203/0139* (2013.01); *H05K 2203/124* (2013.01)

(58) Field of Classification Search
CPC . H05K 2201/0769; H05K 2201/09045; H05K 2203/0139; H05K 2203/124; H05K 3/0058; H05K 3/04; H05K 3/1258
USPC .................................. 427/98.4; 345/170–176
See application file for complete search history.

(56) References Cited

FOREIGN PATENT DOCUMENTS

| | | | |
|---|---|---|---|
| JP | 2008-192850 A | 8/2008 | |
| JP | 2009-146678 A | 7/2009 | |
| JP | WO 2012056774 A1 * | 5/2012 | ........... H01L 51/442 |
| JP | 2013-199691 A | 10/2013 | |
| JP | WO 2015145850 A1 * | 10/2015 | ........... H05K 3/1258 |
| JP | WO 2015146447 A1 * | 10/2015 | ............. G06F 3/044 |
| KR | 10-2013-0011901 A | 1/2013 | |
| WO | WO 2013/012260 A2 | 1/2013 | |
| WO | WO 2013012260 A2 * | 1/2013 | ............. G06F 3/044 |

OTHER PUBLICATIONS

Japanese Office Action, dated Sep. 27, 2016, for Japanese Application No. 2014-069553, together with an English translation thereof.
Korean Office Action and English translation, dated Sep. 20, 2017, for Korean Application No. 10-2016-7023130.
International Search Report for PCT/JP2014/078883 dated Jan. 20, 2015.
Written Opinion of the International Searching Authority for PCT/JP2014/078883 (PCT/ISA/237) dated Jan. 20, 2015.
Chinese Office Action, dated Jun. 26, 2018, for corresponding Chinese Application No. 201480075613.X, together with an English translation thereof.

* cited by examiner

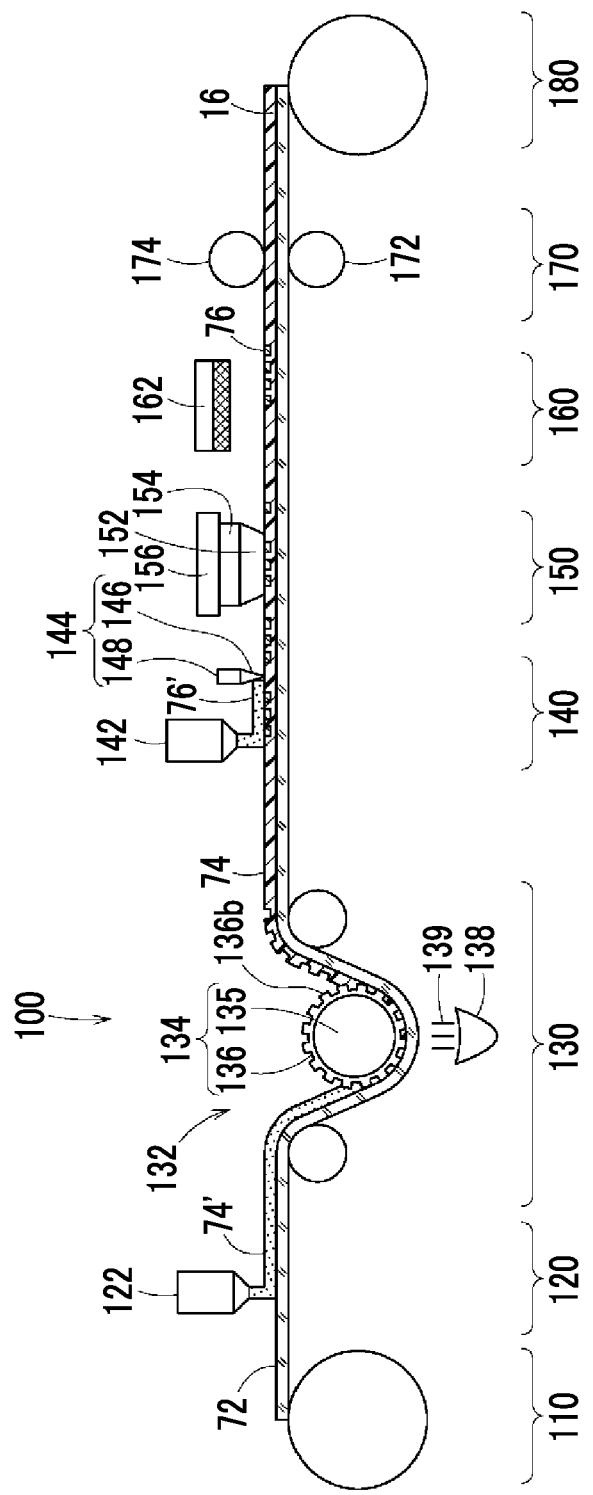

FIG. 15
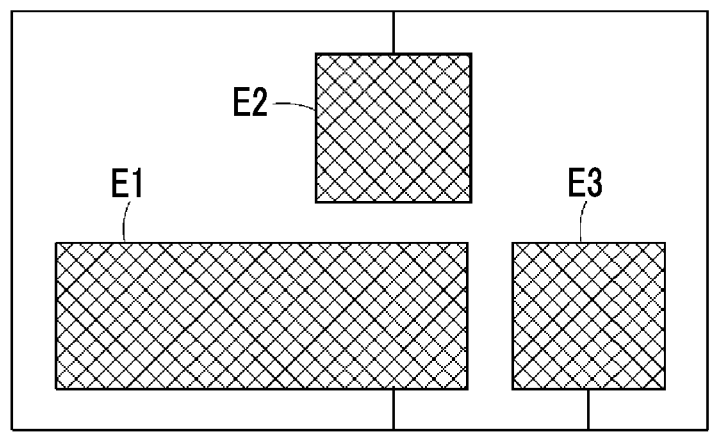
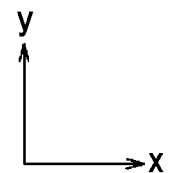

CONDUCTIVE FILM, CONDUCTIVE FILM MANUFACTURING METHOD, AND TOUCH PANEL

CROSS-REFERENCE TO RELATED APPLICATIONS

This application is a Continuation of PCT International Application No. PCT/JP2014/078883 filed on Oct. 30, 2014, which claims priority under 35 U.S.C § 119 (a) to Japanese Patent Application No. 2014-069553 filed on Mar. 28, 2014. Each of the above application(s) is hereby expressly incorporated by reference, in its entirety, into the present application.

BACKGROUND OF THE INVENTION

1. Field of the Invention

The present invention relates to a conductive film and a method for manufacturing the conductive film, and more particularly, to a conductive film that is suitable for, for example, a projected capacitive touch panel, a method for manufacturing the conductive film, and a touch panel using the conductive film.

2. Description of the Related Art

A portable electronic apparatus that is typified by a smart phone is provided with a touch panel as a man machine interface. In recent years, a desktop personal computer (PC) or a notebook PC has been provided with a touch panel. In general, since a PC has a larger screen than a smart phone, a touch panel used in the PC requires high transparency and high conductivity.

A touch panel comprises a conductive film (also referred to as a conductive sheet or a conductive layer) in which electrodes that are formed by thin metal wires having a predetermined pattern are formed on a transparent film. In general, the conductive film is made of indium tin oxide (ITO). However, the film made of ITO has the problems that it is difficult to obtain the high conductivity required for a large screen and costs increase.

In recent years, as a conductive film used instead of an ITO film, a conductive film comprising thin metal wires that are formed in a mesh shape and have high conductivity has drawn attention. KR10-2013-0011901A discloses a technique that forms a mesh-shaped groove portion in a surface of a resin layer and fills the groove portion with high-conductivity metal particles to manufacture a conductive film. This technique comprises a step of applying ink mixed with high-conductivity metal particles and a binder onto the surface of the resin layer in which a bank portion and a groove portion are formed, a step of scraping the surface of the bank portion with a squeegee to fill the groove portion with the ink and to remove the ink, and a step of hardening the ink in the groove portion. The conductive film has the advantage that the conductive film is less likely to be oxidized since the groove portion formed in the surface of the resin layer is filled with the metal particles. In addition, the conductive film has the advantage that manufacturing costs are lower than those when a metal film formed by vacuum deposition is etched. The conductive film has drawn attention due to these advantages.

SUMMARY OF THE INVENTION

It is generally known that metal, particularly, silver or copper causes ion migration. The inventors assumed that, when the groove portion formed in the outer layer of the conductive film was filled with the thin metal wires as in the conductive film manufactured by the technique disclosed in KR10-2013-0011901A, ion migration was less likely to occur. However, in practice, when the conductive film is manufactured by the technique disclosed in KR10-2013-0011901A, in some cases, a small number of metal particles remain on the bank portion formed on the surface of the resin layer after the step of filling the groove portion with the ink and removing the ink using a squeegee. The metal particles remaining on the bank portion are more likely to be exposed to oxygen or water than the metal particles in the groove portion. Therefore, when a voltage is applied to the conductive film, the metal particles remaining on the bank portion are likely to be ionized. The ionized metal particles cause electrochemical migration, that is, so-called ion migration. As a result, an operation error occurs in a touch panel.

In the case of the technique disclosed in KR10-2013-0011901A which scrapes the surface of the resin layer in a predetermined direction using the squeegee to fill the groove portion with the ink and to remove the ink remaining on the bank portion, ion migration is more likely to occur between the electrodes which are arranged in a direction parallel to the scraping direction than between the electrodes which are arranged in a direction perpendicular to the scraping direction.

As a countermeasure against a variation in the degree of occurrence of ion migration due to the difference in the direction, a method can be considered which changes the arrangement of the electrodes in the conductive film, for example, increases the gap between some electrodes. However, the conductive film requires a detection sensitivity and a detection accuracy that are higher than predetermined values and flexibility in the arrangement of the electrodes is limited due to the required performance such as the detection sensitivity and the detection accuracy. As a result, it is difficult to change the arrangement of the electrodes to prevent the occurrence of ion migration.

Therefore, the conductive film manufactured by the technique disclosed in KR10-2013-0011901A has the problem that an operation error is likely to occur due to ion migration.

The invention has been made in view of the above-mentioned problems and an object of the invention is to provide a conductive film that can prevent an operation error caused by ion migration and is suitable for, for example, a projected capacitive touch panel, a method for manufacturing the conductive film, and a touch panel using the conductive film.

A conductive film according to a first aspect of the invention comprises: a substrate; a resin layer that is laminated on the substrate and has a bank portion and a mesh-shaped groove portion formed in a surface; and a thin metal wire that is provided in the groove portion of the resin layer. The thin metal wire forms an electrode pattern. When a value indicating ion migration characteristics of the electrode pattern in a longitudinal direction is ML and a value indicating ion migration characteristics of the electrode pattern in a lateral direction is MS, a migration ratio obtained by dividing the larger of the two values ML and MS by the smaller value is in the range of 1.0 to 1.4.

In the first aspect of the invention, preferably, the value ML is less than the value MS.

In the first aspect of the invention, preferably, the migration ratio is in the range of 1.0 to 1.2.

In the first aspect of the invention, preferably, the resin layer includes a metal capture material.

In the first aspect of the invention, preferably, the thin metal wire includes the metal capture material.

In the first aspect of the invention, preferably, the metal capture material includes at least one material selected from a group that consists of triazoles, imidazoles, tetrazoles, and triazaindolizines.

A conductive film manufacturing method according to a second aspect of the invention includes: a resin layer laminating step of laminating a resin layer on a substrate; a resin layer surface forming step of forming a bank portion and a mesh-shaped groove portion in a surface of the resin layer; an ink filling step of supplying ink including metal particles to the surface of the resin layer and sliding an ink application member on the surface of the resin layer to fill the groove portion with the ink; and an ink removal step of sliding an ink removal member on the surface of the resin layer to remove the ink remaining on the bank portion. A direction in which the ink application member slides in the ink filling step is different from a direction in which the ink removal member slides in the ink removal step.

In the second aspect of the invention, preferably, the direction in which the ink application member slides in the ink filling step is perpendicular to the direction in which the ink removal member slides in the ink removal step.

In the second aspect of the invention, preferably, the direction in which the ink application member slides in the ink filling step is parallel to a longitudinal direction of an electrode pattern.

A conductive film manufacturing method according to a third aspect of the invention includes: a resin layer laminating step of laminating a resin layer on a substrate; a resin layer surface forming step of forming a bank portion and a mesh-shaped groove portion in a surface of the resin layer; an ink filling step of supplying ink including metal particles to the surface of the resin layer and sliding an ink application member on the surface of the resin layer to fill the groove portion with the ink; an ink removal step of sliding an ink removal member on the surface of the resin layer to remove the ink remaining on the bank portion; and a metal capture material addition step of adding a metal capture material.

In the third aspect of the invention, preferably, the metal capture material addition step has a step of adding the metal capture material to the resin layer as a part of the resin layer laminating step.

In the third aspect of the invention, preferably, the metal capture material addition step is performed after the groove portion forming step and, in the metal capture material addition step, the surface of the resin layer is treated by a treatment liquid including the metal capture material.

In the third aspect of the invention, preferably, the metal capture material addition step is a part of the ink removal step and, in the metal capture material addition step, the ink removal member that is impregnated with a treatment liquid including the metal capture material is used.

In the third aspect of the invention, preferably, the metal capture material addition step is a part of the ink filling step and, in the metal capture material addition step, the metal capture material is added to the ink.

In the third aspect of the invention, preferably, the metal capture material includes at least one material selected from a group that consists of triazoles, imidazoles, tetrazoles, and triazaindolizines.

Preferably, a touch panel according to the invention includes the conductive film according to the first aspect of the invention.

According to the conductive film and the conductive film manufacturing method of the invention, it is possible to prevent an operation error caused by ion migration and to prevent an operation error of a touch panel.

BRIEF DESCRIPTION OF THE DRAWINGS

FIG. 3 is a diagram illustrating a conductive film manufacturing apparatus according to the first embodiment.

FIG. 15 is a plan view illustrating a sample pattern for evaluating an electrode pattern according to the invention.

DESCRIPTION OF THE PREFERRED EMBODIMENTS

Hereinafter, embodiments in which a conductive film and a conductive film manufacturing method according to the invention are applied to a touch panel will be described with reference to FIGS. 1 to 17. In the specification, for the term "to" indicating a numerical range, values which are arranged before and after the term "to" are used as a lower limit and an upper limit.

The inventors considered that anisotropy occurred in ion migration due to the following reasons. A slightly uneven portion is formed in the surface of a bank portion of a resin layer and a slightly uneven portion is also formed in a resin contact portion of a squeegee. Therefore, when the squeegee is moved on the surface of the bank portion in one direction, metal particles which are arranged in a line parallel to the moving direction are likely to remain. When there is any row of metal particles between thin metal wires, a conductive path is likely to be formed during the application of a voltage between thin metal wires. The inventors considered that anisotropy occurred in ion migration due to these reasons. The inventors examined a technique for removing metal particles arranged in a line to prevent errors in the operation of a touch panel. As a result, the invention was achieved.

<Structure of Touch Panel>

Figure 1:
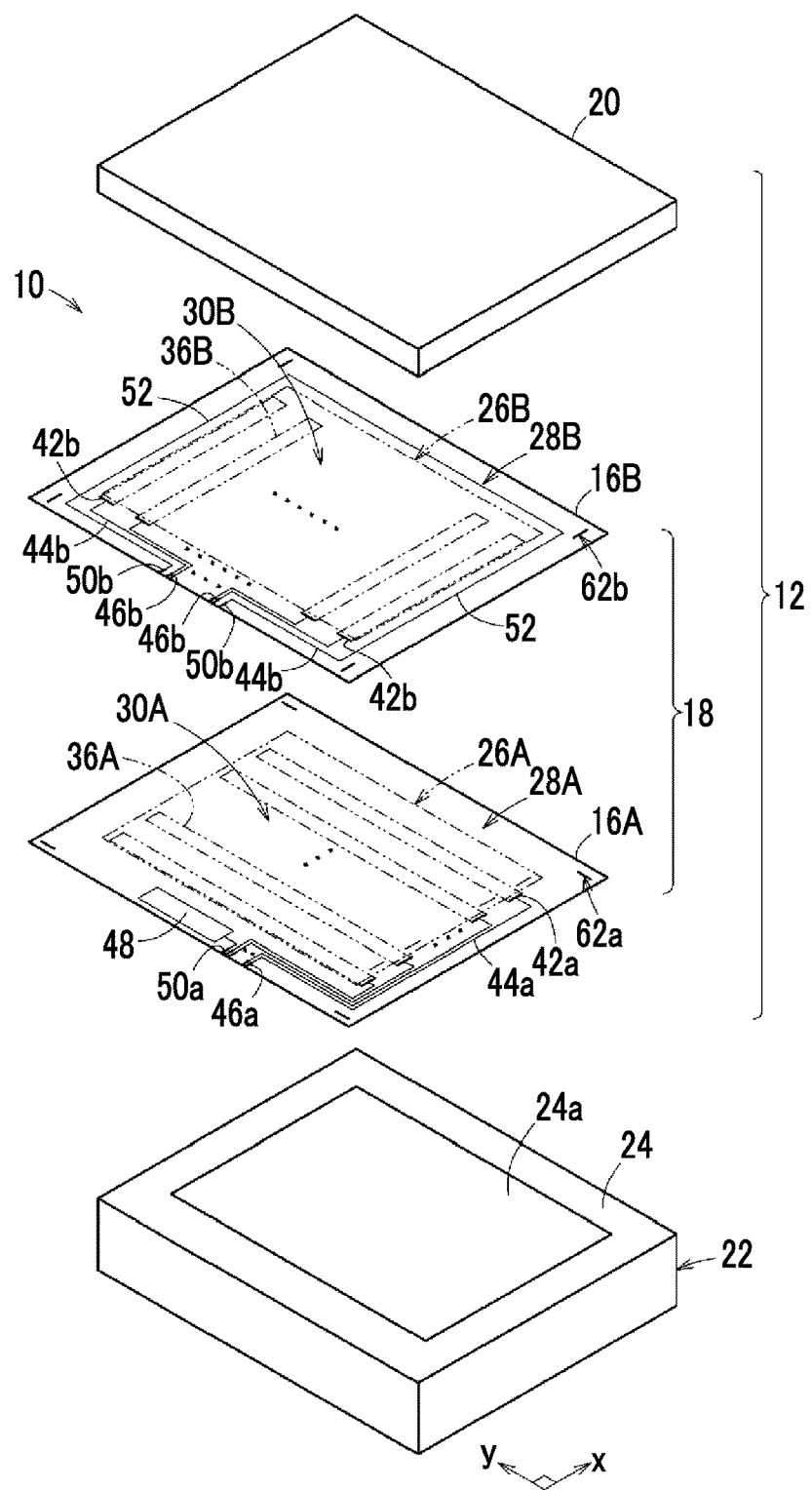
FIG. 1 is an exploded perspective view illustrating a touch panel using a conductive film.

FIG. 1 is an exploded perspective view illustrating a touch panel using a conductive film.

As illustrated in FIG. 1, a touch panel 10 includes a sensor body 12 and a control circuit (not illustrated). The sensor body 12 includes a laminated conductive film 18 that is formed by laminating a first conductive film 16A and a second conductive film 16B and a cover layer 20 that is laminated on the laminated conductive film 18 and is made of, for example, glass. The laminated conductive film 18 and the cover layer 20 are provided on a display panel 24 of a display device 22 such as a liquid crystal display. The first conductive film 16A and the second conductive film 16B include a first sensor region 26A and a second sensor region 26B that correspond to a display screen 24a of the display panel 24, a first terminal wiring region 28A and a second terminal wiring region 28B (so-called frames) that correspond to an outer peripheral portion of the display panel 24, and a first conductive portion 30A that is formed so as to extend from the first sensor region 26A to the first terminal wiring region 28A and a second conductive portion 30B that is formed so as to extend from the second sensor region 26B to the second terminal wiring region 28B, respectively, as viewed from the top.

A plurality of electrode patterns, which are transparent conductive layers including thin metal wires, are formed in the first sensor region 26A. Each electrode pattern has a mesh shape formed by a combination of a plurality of cells and extends in a first direction (y direction) in FIG. 1. In addition, a plurality of electrode patterns are arranged in a second direction (x direction) perpendicular to the first direction. Here, the "cell" indicates a shape that is two-dimensionally partitioned by a plurality of thin metal wires.

As illustrated in FIG. 1, in the first conductive film 16A, a first terminal wiring portion 44a, which is a thin metal wire, is electrically connected to one end portion of each of the first electrode patterns 36A through a first connection portion 42a. The first terminal wiring portion 44a extends from each of the first connection portions 42a to a substantially central portion of one long side of the first conductive film 16A and is electrically connected to a corresponding first terminal portion 46a. In addition, an electrode film 48 is formed in the first terminal wiring region 28A. The electrode film 48 is electrically connected to a first ground terminal portion 50a.

A plurality of electrode patterns, which are transparent conductive layers including thin metal wires, are formed in the second sensor region 26B. Each electrode pattern has a mesh shape formed by a combination of a plurality of cells and extends a second direction (x direction) in FIG. 1. In addition, a plurality of electrode patterns are arranged in the first direction (y direction).

As illustrated in FIG. 1, in the second conductive film 16B, a second terminal wiring portion 44b, which is a thin metal wire, is electrically connected to one end portion of each of the second electrode patterns 36B through a second connection portion 42b. The second terminal wiring portion 44b extends from each of the second connection portions 42b to a substantially central portion of one long side of the second conductive film 16B and is electrically connected to a corresponding second terminal portion 46b. In addition, a ground line 52 is formed outside the second terminal wiring portion 44b such that it surrounds the second sensor region 26B and is connected from one second ground terminal portion 50b to the other second ground terminal portion 50b, in order to obtain a shield effect.

As illustrated in FIG. 1, it is preferable that first alignment marks 62a and second alignment marks 62b for positioning which are used when the first conductive film 16A and the second conductive film 16B are bonded to each other are formed at, for example, each corner of the first conductive film 16A and the second conductive film 16B, respectively. In a case in which the first conductive film 16A and the second conductive film 16B are bonded to form the laminated conductive film 18, the first alignment marks 62a and the second alignment marks 62b become new composite alignment marks. The composite alignment marks may be used as alignment marks for positioning which are used when the laminated conductive film 18 is provided in the display panel 24.

In addition to the first electrode pattern 36A and the second electrode pattern 36B, a dummy electrode may be formed. The dummy electrode is electrically insulated from other electrodes so as not to have an influence on a detection function and an operation function of the first electrode pattern 36A and the second electrode pattern 36B.

Next, first and second embodiments of the structure of a conductive film, a conductive film manufacturing apparatus, and a conductive film manufacturing method will be described.

[First Embodiment]

<Conductive Film According to First Embodiment>

Figure 2:
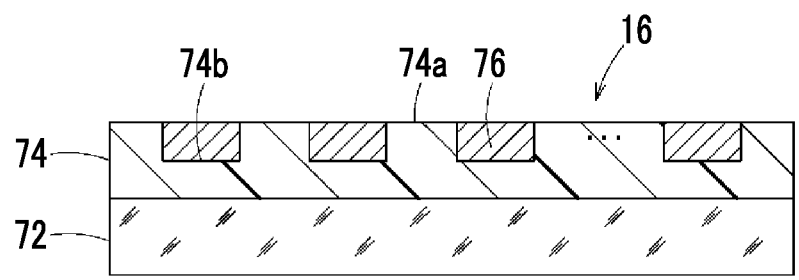
FIG. 2 is a cross-sectional view illustrating a conductive film according to a first embodiment, of which a part is not illustrated.

FIG. 2 is a cross-sectional view illustrating a conductive film according to the first embodiment, of which a part is not illustrated. A conductive film 16 comprises a substrate 72, a resin layer 74 that is laminated on the substrate 72 and includes a bank portion 74a and a mesh-shaped groove portion 74b, and a thin metal wire 76 that is provided in the groove portion 74b of the resin layer 74. The thin metal wire 76 is arranged on the outer layer of the resin layer 74 to form a mesh-shaped electrode pattern. When a value indicating ion migration characteristics of the electrode pattern in the longitudinal direction is ML and a value indicating ion migration characteristics of the electrode pattern in the lateral direction is MS, the migration ratio of the conductive film 16 obtained by dividing the larger of the two values ML and MS by the smaller value is in the range of 1.0 to 1.4.

The term "ion migration characteristics" is an index indicating the degree of ion migration which occurs between conductors that need to be insulated, for example, between adjacent electrode patterns or between wires that extend from the electrode patterns. When a predetermined voltage is applied between adjacent conductors, the "ion migration characteristics" can be quantified by measuring the time when a resistance value is less than a predetermined value. In the specification, the value is referred to as a value indicating the ion migration characteristics or a value of the ion migration characteristics. In a case in which the electrode pattern extends in one direction, it is assumed that a value indicating the ion migration characteristics in the direction in which the electrode pattern extends, that is, the longitudinal direction is ML and a value indicating the ion migration characteristics in a direction perpendicular to the extension direction, that is, the lateral direction is MS. In the case of the first conductive film 16A illustrated in FIG. 1, a value indicating the ion migration characteristics in the y direction which is the longitudinal direction of the first electrode pattern 36A is ML and a value indicating the ion migration characteristics in the x direction which is the lateral 1 direction of the first electrode pattern 36A is MS. In the case of the second conductive film 16B, a value indicating the ion migration characteristics in the longitudinal direction of the second electrode pattern 36B, that is, the x direction is ML and a value indicating the ion migration characteristics in the lateral direction of the second electrode pattern 36B, that is, the y direction is MS. A method for measuring the ion migration characteristics in a general conductive film will be described at the end of the specification.

The substrate 72 is a film-shaped member having predetermined transparency and flexibility. The substrate 72 can be made of a resin, such as polyethylene terephthalate (PET), polycarbonate (PC), polymethyl methacrylate (PMMA), polyimide (PI), acryl, Polyethylene naphthalate (PEN), triacetate cellulose (TAC), or polyether sulfone (PES). It is preferable that the thickness of the substrate 72 is in the range of 25 μm to 250 μm. The light transmittance of the substrate 72 is preferably equal to or greater than 80% and more preferably equal to or greater than 90%.

The resin layer 74 is laminated on one surface of the substrate 72. The resin layer 74 can be made of a resin having predetermined transparency and flexibility. In particular, it is preferable that the resin layer 74 is made of a prepolymer, an oligomer, and/or a monomer having a polymerizable saturated bond or an epoxy group in a molecule and is made of an ultraviolet-curable resin having a photopolymerization initiator or an additive mixed therein, if necessary. It is preferable that the ultraviolet-curable resin is photosensitive, reacts to the energy of ultraviolet rays and is hardened in a short time.

Examples of the prepolymer and the oligomer in the ultraviolet-curable resin include unsaturated polyesters, such as a condensation product of unsaturated dicarboxylic acid and polyhydric alcohol, methacrylates, such as polyester methacrylate, polyethermethacrylate, polyolmethacrylate, and melaminemethacrylate, acrylates, such as polyesteracrylate, epoxyacrylate, urethaneacrylate, polyetheracrylate, polyolacrylate, melamineacrylate, and a cation polymerizable epoxy compound.

Example of the monomer in the ultraviolet-curable resin include a styrene-based monomer, such as styrene and α-methylstyrene, acrylic acid esters, such as methyl acrylate, acrylic acid-2-ethylhexyl, acrylic acidmethoxyethyl, acrylic acidbutoxyethyl, butyl acrylate, acrylic acid-methoxybutyl, and acrylic acidphenyl, methacrylic esters, such as methyl methacrylate, ethyl methacrylate, propyl methacrylate, methacrylic acidmethoxyethyl, methacrylic acidethoxymethyl, methacrylic acidphenyl, and methacrylic acidlauryl, unsaturated substituted aminoalcoholesters, such as acrylic acid-2-(N,N-diethylamino)ethyl, acrylic acid-2-(N,N-dimethylamino)ethyl, acrylic acid-2-(N,N-dibenzylamino)methyl, and acrylic acid-2-(N,N-diethylamino)propyl, unsaturated carboxylic acidamides, such as acrylamide and methacrylamide, compounds, such as ethylene glycol diacrylate, propylene glycol diacrylate, neopentyl glycol diacrylate, 1,6-hexane diol diacrylate, and triethylene glycol diacrylate, polyfunctional compounds, such as dipropylene glycol diacrylate, ethylene glycol diacrylate, propylene glycol dimethacrylate, and diethylene glycol dimethacrylate, and/or polythiol compounds having two or more thiol groups in a molecule, such as trimethylol propane trithioglycolate, trimethylol propane trithiopropionate, and pentaerythritol tetrathioglycolate.

Examples of the photopolymerization initiator include acetophenones, benzophenones, Michler's benzoylbenzoate, o-benzoylbenzoic acidmethyl, aldoxime, tetramethylthiuram monosulfide, thioxanthone, and/or n-butylamine, triethylamine, and tri-butylphosphine which are photosensitizers.

The ultraviolet-curable resin is disclosed in WO2007/034643.

The bank portion 74a which is partitioned by the mesh-shaped electrode pattern and the groove portion 74b which is formed so as to correspond to the mesh-shaped electrode pattern are formed in the surface of the resin layer 74. The groove portion 74b and the bank portion 74a are formed by pressing a mold against the surface of the resin layer 74. The representative examples of the cross-sectional shape of the groove portion 74b are a triangle and a trapezoid. However, the cross-sectional shape of the groove portion 74b may be an arc. It is preferable that both the width and depth of the opening of the groove portion 74b are in the range of 1 μm to 10 μm.

The thin metal wire 76 is provided in the groove portion 74b to form the mesh-shaped electrode pattern. In this embodiment, conductive silver paste may be used as the thin metal wire 76. For example, REXALPHA (registered trademark) RF FS 015 manufactured by Toyo Ink Co., Ltd. can be hardened and used as the material forming the thin metal wire 76. In addition to the conductive silver paste, copper paste, silver-carbon, aluminum, nickel, chromium, nickel-phosphorus, and carbon black can be used. It is preferable that the width of the thin metal wire 76 is equal to the width of the groove portion 74b and is in the range of 1 μm to 10 μm. It is preferable that the width and depth of the thin metal wire 76 are equal to those of the groove portion 74b and are in the range of 1 μm to 10 μm.

In this embodiment, the ratio of the value indicating the ion migration characteristics in one direction to the value indicating the ion migration characteristics in the other direction is calculated in order to determine whether the conductive film is defective. Specifically, the larger of the value ML indicating the ion migration characteristics of the electrode patterns 36A and 36B in the longitudinal direction and the value MS indicating the ion migration characteristics of the electrode patterns 36A and 36B in the lateral direction is divided by the smaller value to calculate the migration ratio. In this embodiment, the migration ratio of the conductive film 16 is in the range of 1.0 to 1.4 and preferably in the range of 1.0 to 1.2. In addition, a difference in voltage between the electrode patterns 36A and 36B is less likely to occur in the longitudinal direction. Therefore, a small amount of ion migration does not cause any problem. In contrast, the ion migration characteristics of the electrode patterns 36A and 36B in the lateral direction are low (resistance is reduced in a short time), but cause a shot. Therefore, it is preferable that the value ML is less than the value MS.

<Conductive Film Manufacturing Apparatus According to First Embodiment>

FIG. 3 is a diagram illustrating the conductive film manufacturing apparatus according to the first embodiment. In this embodiment, the conductive film manufacturing apparatus is a roll-to-roll type. In the following description, a film-shaped processed product that is transported between processing stages, for example, a film-shaped substrate or a film-shaped substrate having a resin layer laminated thereon is simply referred to as a film.

A conductive film manufacturing apparatus 100 includes stations, such as a substrate feed unit 110, a resin layer laminating unit 120, a resin layer surface forming unit 130, an ink filling unit 140, an ink removal unit 150, an ink hardening unit 160, a cleaning unit 170, and a substrate winding unit 180 which are provided in this order from the upstream side to the downstream side in a film transport direction.

The substrate feed unit 110 comprises the film-shaped substrate 72 that is wound in a roll shape and transports the substrate 72 to the downstream side at a predetermined transport speed.

The resin layer laminating unit 120 is provided on the downstream side of the substrate feed unit 110 in the film transport direction. The resin layer laminating unit 120 comprises an application portion 122 that applies a liquid ultraviolet-curable resin onto the surface of the substrate 72 to form a liquid resin layer 74'. For example, a roll coater or an extrusion film forming device is used as the application portion 122.

The resin layer surface forming unit 130 is provided on the downstream side of the resin layer laminating unit 120 in the film transport direction. The resin layer surface forming unit 130 comprises a pressing portion 132 and an ultraviolet emitting portion 138.

The pressing portion 132 includes a cylindrical mold 134 that is provided on the surface side of the film, that is, on the side of the resin layer 74. The mold 134 includes a cylindrical roller 135 and a sheet-shaped mold 136 that is made of metal and is wound around an outer circumferential surface of the roller 135 and is fixed thereto. A convex portion 136b corresponding to a groove pattern that is transferred to the resin layer 74' is formed on an outer circumferential surface of the sheet-shaped mold 136.

Next, a method for manufacturing the sheet-shaped mold 136 will be described.

Figure 4A:
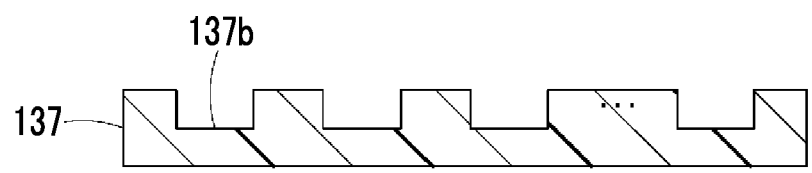
FIGS. 4A to 4C are diagrams illustrating a mold manufacturing process.
Figure 4B:
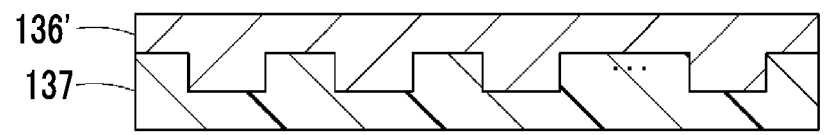
Figure 4C:
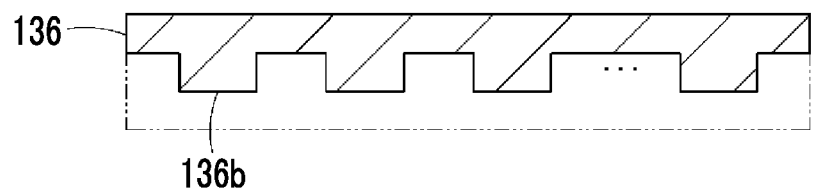

FIGS. 4A to 4C are diagrams illustrating a sheet-shaped mold manufacturing process.

First, as illustrated in FIG. 4A, grooves 137b are formed in the same pattern as the mesh-shaped electrode pattern on one surface of a glass plate 137 by lithography or machine processing to form a pattern of the sheet-shaped mold 136. Then, as illustrated in FIG. 4B, nickel (Ni) is electrodeposited on the surface of the glass plate 137, in which the grooves 137b are formed, by electrocasting to form a Ni sheet 136'. Then, as illustrated in FIG. 4C, when the Ni sheet 136' with a necessary thickness is formed on the surface of the glass plate 137 in which the grooves 137b are formed, the glass plate 137 is removed from the Ni sheet 136' and the sheet-shaped mold 136 is obtained. The sheet-shaped Ni mold 136 is wound around the outer circumferential surface of the roller 135 and is fixed thereto. In this way, the mold 134 is completed.

When a surface treatment is performed on the surface of the sheet-shaped Ni mold 136, it is easy to separate the resin layer 74 of the conductive film 16 from the mold 134 during the manufacture of the conductive film 16. As the surface treatment, for example, sputtering can be used to form a $SiO_2$ film with a thickness of about 1200 Å to 1500 Å. In addition, various types of surface treatments can be performed.

The ultraviolet emitting portion 138 is provided on the rear surface side of the film, that is, on the side of the substrate 72 and is arranged at the same position as the pressing portion 132 or is arranged so as to slightly deviate from the pressing portion 132 to the downstream side in the film transport direction. The ultraviolet emitting portion 138 emits ultraviolet light 139 with a wavelength of about 100 nm to 400 nm to the film. The ultraviolet light 139 produces a chemical reaction (photopolymerization reaction) to the resin layer 74' to harden the resin layer 74'. For example, an ultra-high pressure mercury lamp, a high-pressure mercury lamp, a low-pressure mercury lamp, a carbon-arc lamp, a xenon-arc lamp, or a metal halide lamp can be used as a light source of the ultraviolet emitting portion 138. These light sources may be an air-cooled type or a water-cooled type. It is preferable that the light sources are a water-cooled type.

The ink filling unit 140 is provided on the downstream side of the resin layer surface forming unit 130 in the film transport direction. The ink filling unit 140 comprises an ink supply portion 142 and a squeegee portion 144.

The ink supply portion 142 applies paste ink 76' including metal particles which are the material forming the thin metal wire 76 onto the surface of the resin layer 74. The ink 76' may be continuously supplied or may be discontinuously supplied. For example, the ink 76' may be supplied at a predetermined interval. The amount of ink 76' supplied is determined according to the transport speed of the film.

The squeegee portion 144 is provided on the downstream side of the ink supply portion 142 in the film transport direction. The squeegee portion 144 includes a first squeegee blade 146 that spreads and applies the ink 76' supplied to the surface of the resin layer 74 on the resin layer 74 and a first squeegee holder 148 that holds the first squeegee blade 146. The first squeegee blade 146 is made of, for example, urethane rubber, silicon rubber, or metal and has a width that is equal to or greater than the width of the film. The first squeegee blade 146 is arranged such that the width direction of the blade is perpendicular to the film transport direction, a leading end portion of the blade comes into contact with the surface of the resin layer 74, and the angle formed between the blade and the surface of the resin layer 74 is a predetermined value. According to this arrangement, with the transport of the film, the leading end portion of the first squeegee blade 146 is moved relative to the surface of the resin layer 74 in a direction opposite to the film transport direction while coming into contact with the surface of the resin layer 74. That is, the first squeegee blade 146 slides along the surface of the resin layer 74. In this case, the first squeegee blade 146 pushes a portion of the ink 76' into the groove portion 74b of the resin layer 74 to fill the groove portion 74b with the ink 76' while scraping the surface of the resin layer 74 in the direction opposite to the film transport direction. At the same time, the first squeegee blade 146 removes the ink 76' from the surface of the bank portion 74a of the resin layer 74.

In addition, a driving device for driving the first squeegee blade 146 may be provided in the squeegee portion 144. In this case, the driving direction of the first squeegee blade 146 can be freely set.

The ink removal unit 150 is provided on the downstream side of the ink filling unit 140 in the film transport direction. The ink removal unit 150 includes a second squeegee blade 152 that removes the ink 76' remaining on the surface of the bank portion 74a of the resin layer 74, a second squeegee holder 154 that holds the second squeegee blade 152, and a driving unit 156 that holds the second squeegee holder 154 and drives the second squeegee blade 152 and the second squeegee holder 154 in a direction perpendicular to the film transport direction. The second squeegee blade 152 is made of, for example, urethane rubber, silicon, or metal. The width of the second squeegee blade 152 is not particularly limited. However, when the width of the second squeegee blade 152 is too large, strong force is needed in order to obtain pressing force required to remove ink. When the width is too small, the area of the ink 76' that can be removed by one process is reduced. Therefore, it is preferable to appropriately set the width when a conductive film is manufactured. The second squeegee blade 152 is arranged such that the width direction of the blade is parallel to the film transport direction, a leading end portion of the blade comes into contact with the surface of the resin layer 74, and the angle formed between the blade and the surface of the resin layer 74 is a predetermined value. According to this arrangement, with the driving of the second squeegee blade 152 by the driving unit 156, the leading end portion of the second squeegee blade 152 is moved while coming into contact with the surface of the resin layer 74. That is, the second squeegee blade 152 slides along the surface of the resin layer 74. In this case, the second squeegee blade 152 scrapes the surface of the resin layer 74 in the direction perpendicular to the film transport direction to remove the ink 76' remaining on the surface of the bank portion 74a.

The ink hardening unit 160 is provided on the downstream side of the ink removal unit 150 in the film transport direction. The ink hardening unit 160 comprises a heater 162. The heater 162 emits heat, a hot wind, infrared rays, or near infrared rays required to harden the ink 76' in the groove portion 74b of the resin layer 74 to the resin layer 74.

The cleaning unit 170 is provided on the downstream side of the ink hardening unit 160 in the film transport direction. The cleaning unit 170 comprises a supporting roller 172 and a cleaning roller 174. The supporting roller 172 supports the film from the side of the substrate 72. The cleaning roller 174 comes into contact with the surface of the resin layer 74 and cleans the bank portion 74a. The cleaning roller 174 may include a cleaning liquid in order to effectively perform cleaning. For example, a mixed liquid in which isopropyl alcohol and acetone are mixed at a ratio of 9:1 to 8:2 can be used as the cleaning liquid. In addition, the cleaning unit 170 may include a plurality of supporting rollers 172.

The substrate winding unit 180 is provided on the downstream side of the cleaning unit 170 in the film transport direction. The substrate winding unit 180 winds the cleaned film, that is, the conductive film 16 around a roller.

The structure of the conductive film manufacturing apparatus used in this embodiment has been described above. However, other types of apparatuses can be used. For example, the ink filling unit 140, the ink removal unit 150, and the ink hardening unit 160 may be incorporated into one unit and a plurality of units may be provided between the resin layer surface forming unit 130 and the cleaning unit 170. In this case, an ink filling process, an ink removal process, and an ink hardening process are performed a plurality of times to form a plurality of layers of the thin metal wire 76 provided in the groove portion 74b of the resin layer 74. In addition, when the type of metal material is changed between the units, the thin metal wires 76 provided in the groove portions 74b of the resin layer 74 are arranged in different types of metal layers.

In the conductive film manufacturing apparatus 100, a direction in which the first squeegee blade 146 of the ink filling unit 140 scrapes the surface of the resin layer 74 is perpendicular to a direction in which the second squeegee blade 152 of the ink removal unit 150 scrapes the surface of the resin layer 74. However, the two directions may not be perpendicular to each other. When the two directions are not parallel to each other, an ion migration prevention effect can be expected to some extent.

The conductive film manufacturing apparatus 100 illustrated in FIG. 3 is a roll-to-roll type. However, the conductive film manufacturing apparatus 100 may be a sheet-to-sheet type.

<Conductive Film Manufacturing Method According to First Embodiment>

Figure 5:
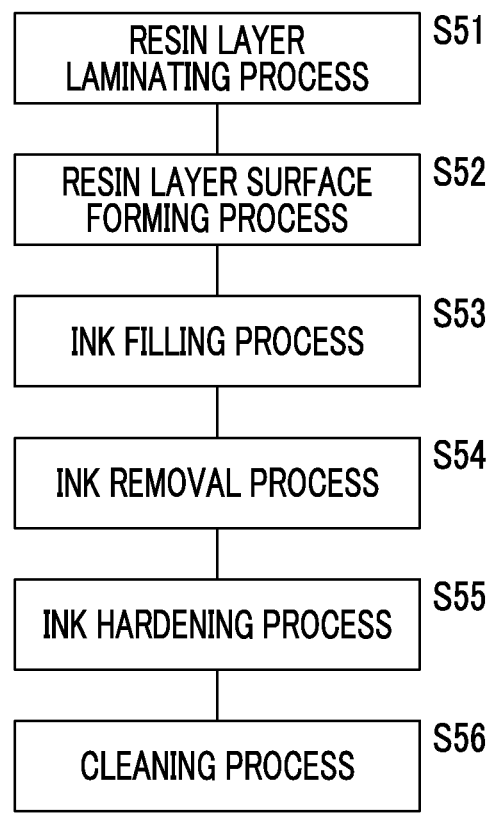
FIG. 5 is a flowchart illustrating a conductive film manufacturing process according to the first embodiment.

FIG. 5 is a flowchart illustrating a conductive film manufacturing process according to the first embodiment. The conductive film manufacturing method according to the first embodiment illustrated in FIG. 5 will be described with appropriate reference to FIG. 3.

First, a film is transported from the substrate feed unit 110 to the resin layer laminating unit 120. The resin layer laminating unit 120 performs a resin layer laminating process that laminates the resin layer 74' on the substrate 72 (Step S51). Specifically, an ultraviolet-curable resin is applied onto the substrate 72 to form the resin layer 74'. In this stage, the resin layer 74' is not hardened.

When the resin layer laminating process (Step S51) ends, the film is transported from the resin layer laminating unit 120 to the resin layer surface forming unit 130. The resin layer surface forming unit 130 performs a resin layer surface forming process that forms the bank portion 74a and the mesh-shaped groove portion 74b in the surface of the resin layer 74' (Step S52). Specifically, the resin layer surface forming unit 130 presses the mold 134 against the surface of the resin layer 74' with predetermined pressure while synchronizing the rotation speed of the mold 134 with the transport speed of the film, thereby transferring the pattern formed in the surface of the mold 134 to the surface of the resin layer 74'. In addition, the ultraviolet emitting portion 138 emits the ultraviolet light 139 to the rear surface of the film, that is, the substrate 72 at the same time when the mold 134 is pressed against the resin layer 74' or immediately after the mold 134 is pressed against the resin layer 74'. When the ultraviolet light 139 passes through the substrate 72 and reaches the resin layer 74', the resin layer 74' produces a chemical reaction and becomes a hardened resin layer 74.

When the resin layer surface forming process (Step S52) ends, the film is transported from the resin layer surface forming unit 130 to the ink filling unit 140. The ink filling unit 140 performs an ink filling process that supplies the ink 76' including metal particles to the surface of the resin layer 74 and slides an ink application member, that is, the first squeegee blade 146 on the surface of the resin layer 74 such that the groove portion 74b is filled with the ink 76' (Step S53). Specifically, a predetermined amount of ink 76' is supplied from the ink supply portion 142 to the surface of the resin layer 74. Then, the first squeegee blade 146 is arranged on the downstream side of an ink supply position in the film transport direction such that the width direction of the leading end thereof is perpendicular to the film transport direction and the leading end comes into contact with the surface of the resin layer 74, strictly, the surface of the bank portion 74a with predetermined pressure. Then, with the transport of the film, the first squeegee blade 146 is moved relative to the resin layer 74 in a direction opposite to the film transport direction. In this way, the first squeegee blade 146 slides on the surface of the resin layer 74 in the direction opposite to the film transport direction to fill the groove portion 74b with the ink 76' while scraping the surface of the bank portion 74a to remove the ink 76'.

When the ink filling process (Step S53) ends, the film is transported from the ink filling unit 140 to the ink removal unit 150. The ink removal unit 150 performs an ink removal process that slides an ink removal member, that is, the second squeegee blade 152 on the surface of the resin layer 74 to remove the ink 76' remaining on the bank portion 74a (Step S54). Specifically, the leading end of the second squeegee blade 152 is arranged such that the width direction thereof is parallel to the film transport direction and comes into contact with the surface of the resin layer 74, strictly, the surface of the bank portion 74a with predetermined pressure. In addition, the second squeegee blade 152 is moved in a direction perpendicular to the film transport direction. In this way, the second squeegee blade 152 slides on the surface of the resin layer 74 in the direction perpendicular to the film transport direction to scrape the ink 76' off the bank portion 74a.

When the ink removal process (Step S54) ends, the film is transported from the ink removal unit 150 to the ink hardening unit 160. The ink hardening unit 160 performs an ink hardening process that hardens the ink 76' in the groove portion 74b using a heat treatment (Step S55). For example, the heat treatment is performed at 150° C. for about 3 minutes to 10 minutes to harden the ink 76' and the thin metal wire 76 is obtained.

When the ink hardening process (Step S55) ends, the film is transported from the ink hardening unit 160 to the cleaning unit 170. The cleaning unit 170 performs a cleaning process that cleans the surface of the resin layer 74 with the cleaning roller 174 (Step S56).

When the cleaning process (Step S56) ends, the conductive film 16 is completed. The substrate winding unit 180 winds the conductive film 16. In this way, a series of processes ends.

In this embodiment, the direction in which the bank portion 74a is scraped by the first squeegee blade 146 in the ink filling process (Step S53) is perpendicular to the direction in which the bank portion 74a is scraped by the second squeegee blade 152 in the ink removal process (Step S54). However, when the two scraping directions are not the same, the effect of preventing ion migration caused by the remaining ink can be expected to some extent. That is, the direction in which the bank portion 74a is scraped by the first squeegee blade 146 is preferably different from the direction in which the bank portion 74a is scraped by the second squeegee blade 152. For example, the leading end of one of the first squeegee blade 146 and the second squeegee blade 152 may be fixed in a direction perpendicular to the film transport direction and the other squeegee blade may be driven in a direction other than the film transport direction. In addition, the first squeegee blade 146 and the second squeegee blade 152 may be driven in different directions.

According to the first embodiment, the direction in which the surface of the resin layer is scraped by the squeegee during filling with ink is different from the direction in which the surface of the resin layer is scraped by the squeegee during the removal of ink. Therefore, when ink is removed, it is possible to effectively remove metal particles which remain on the surface of the resin layer after filling with ink, particularly, metal particles which are arranged in a line in the direction in which the surface of the resin layer is scraped by the squeegee. In addition, even if some metal particles remain, it is possible to prevent a state in which the metal particles are arranged in a line and a conductive path is likely to be formed. The manufactured conductive film can prevent a situation in which ion migration is likely to occur in a specific direction and can reduce the in-plane anisotropy of the ion migration characteristics of the conductive layer.

[Second Embodiment]

In the first embodiment, the direction in which the surface of the resin layer is scraped by the squeegee during filling with ink is different from the direction in which the surface of the resin layer is scraped by the squeegee during the removal of ink. Therefore, the metal particles that remain on the bank portion 74a are removed and ion migration is prevented. In a second embodiment, the direction in which the surface of the resin layer is scraped by the squeegee during filling with ink does not need to be different from the direction in which the surface of the resin layer is scraped by the squeegee during the removal of ink. Instead of this structure, a metal capture material is used to prevent ion migration.

<Conductive Film According to Second Embodiment>

Figure 6:
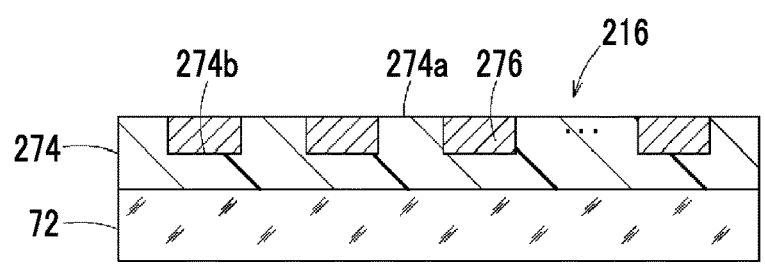
FIG. 6 is a cross-sectional view illustrating a conductive film according to a second embodiment, of which a part is not illustrated.

FIG. 6 is a cross-sectional view illustrating a conductive film according to the second embodiment, in which a part of the conductive film is not illustrated. Many parts of a conductive film 216 are the same as those of the conductive film 16 according to the first embodiment. In the conductive film 216 illustrated in FIG. 6, the same parts as those in the conductive film 16 according to the first embodiment illustrated in FIG. 2 are denoted by the same reference numerals and the description thereof will not be repeated. The conductive film 216 according to the second embodiment differs from the conductive film 16 according to the first embodiment in materials included in a resin layer 274 and a thin metal wire 276.

The conductive film 216 comprises a substrate 72, a resin layer 274 that is laminated on the substrate 72 and includes a bank portion 274a and a mesh-shaped groove portion 274b, and a thin metal wire 276 that is provided in the groove portion 274b of the resin layer 274. The thin metal wire 276 is arranged on a surface layer of the resin layer 274 to form a mesh-shaped electrode pattern. Similarly to the first embodiment, the resin layer 274 can be made of an ultraviolet-curable resin having predetermined transparence and flexibility. Similarly to the first embodiment, conductive silver paste, for example, REXALPHA (registered trademark) RF FS 015 manufactured by Toyo Ink Co., Ltd. can be hardened and used as the material forming the thin metal wire 276. In addition to the conductive silver paste, copper paste, silver-carbon, aluminum, nickel, chromium, nickel-phosphorus, and carbon black can be used. It is preferable that the width of the thin metal wire 276 is equal to the width of the groove portion 274b and is in the range of 1 μm to 10 μm. It is preferable that the width and depth of the thin metal wire 276 are equal to those of the groove portion 274b and are in the range of 1 μm to 10 μm.

At least one compound (hereinafter, referred to as a "metal capture material") selected from a group that consists of imidazoles, triazoles, tetrazoles, and triazaindolizines can be used as the material for capturing metal.

Examples of imidazoles include 2-mercaptoimidazole, 2-mercaptoimidazole-5-sulfonic acidsodium, and 6-nitrobenzoimidazole. Examples of triazoles include 2-mercaptotriazole, benzotriazole, 5-methylbenzotriazole, 5-nitrobenzotriazole, 5-chlorobenzotriazole, and 5-bromobenzotriazole. Examples of tetrazoles include 2-mercaptotetrazole, 2-mercaptotetrazole-5-sulfonic acidsodium, and 1-phenyl-5-mercaptotetrazole. Examples of triazaindolizines include 5-methyl-7-oxy-1,3,4-triazaindolizine.

It has been known that the metal capture material is added to reduce the in-plane anisotropy of the ion migration characteristics. The inventors infer the following as the mechanism. The metal capture material forms a complex with metal and is stabilized. Therefore, it is considered that, when the metal capture material is added, a small number of metal particles which are arranged in a line in the bank portion after an ink filling process are naturally diffused to a region in which the concentration of the metal capture material is high and the state in which the metal particles are arranged in a line is released. It is effective to perform a metal capture material addition process in a resin laminating process. However, the time when the metal capture material addition process is performed or an addition method is not particularly limited. The metal capture material addition process may be performed after the resin layer surface forming process. The metal capture material may be added to ink including metal particles in the ink filling process or may be added to a removal liquid in the ink removal process. In this case, the same effect as described above can be expected.

The conductive film 216 can be manufactured by some manufacturing apparatuses and manufacturing methods. In the specification, four manufacturing apparatuses and manufacturing methods will be described.

<Conductive Film Manufacturing Apparatus (1) According to Second Embodiment>

Figure 7:
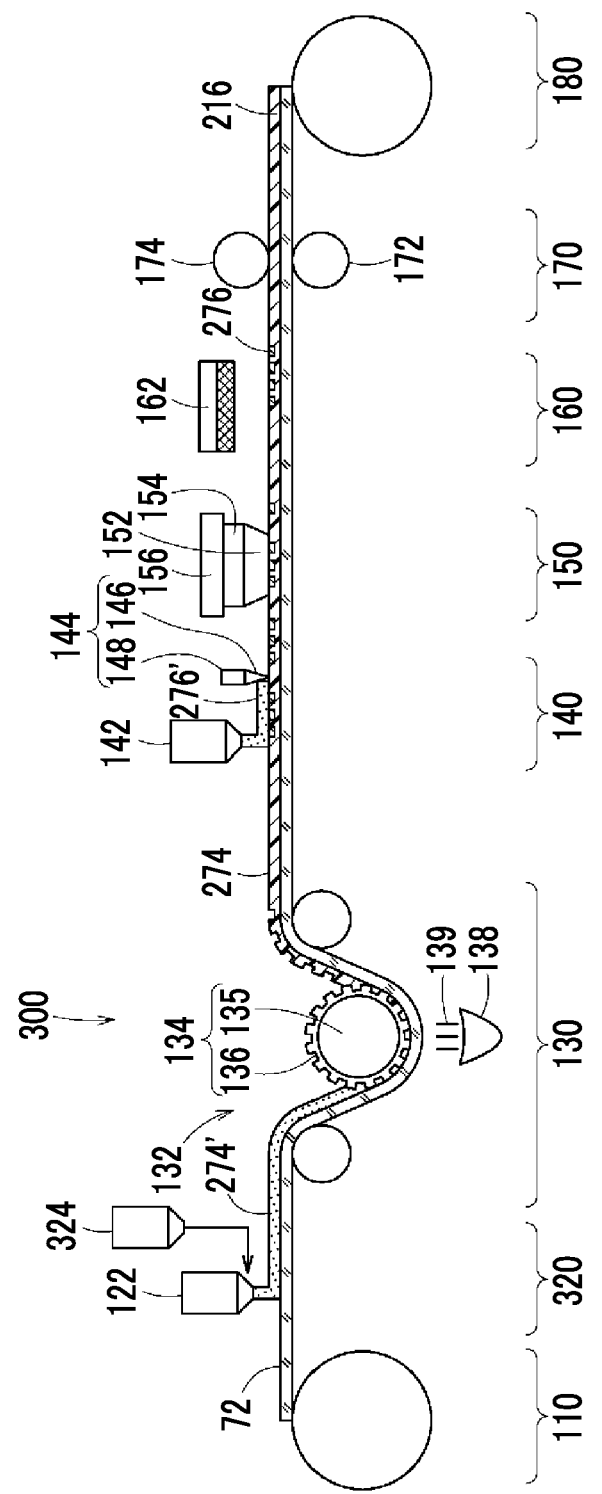
FIG. 7 is a diagram illustrating a conductive film manufacturing apparatus (1) according to the second embodiment.

FIG. 7 is a diagram illustrating a conductive film manufacturing apparatus (1) according to the second embodiment. Many parts of a conductive film manufacturing apparatus 300 are the same as those of the conductive film manufacturing apparatus 100 according to the first embodiment. In the conductive film manufacturing apparatus 300 illustrated in FIG. 7, the same parts as those in the conductive film manufacturing apparatus 100 according to the first embodiment illustrated in FIG. 3 are denoted by the same reference numerals and the description thereof will not be repeated. The conductive film manufacturing apparatus 300 differs from the conductive film manufacturing apparatus 100 in that it includes a resin layer laminating unit 320.

The resin layer laminating unit 320 is provided on the downstream side of the substrate feed unit 110 in a film transport direction. The resin layer laminating unit 320 comprises an addition portion 324 that adds the metal capture material to an ultraviolet-curable resin and an application portion 122 that applies the liquid ultraviolet-curable resin onto a surface of the substrate 72 to form a liquid resin layer 274'.

<Conductive Film Manufacturing Method (1) According to Second Embodiment>

Figure 8:
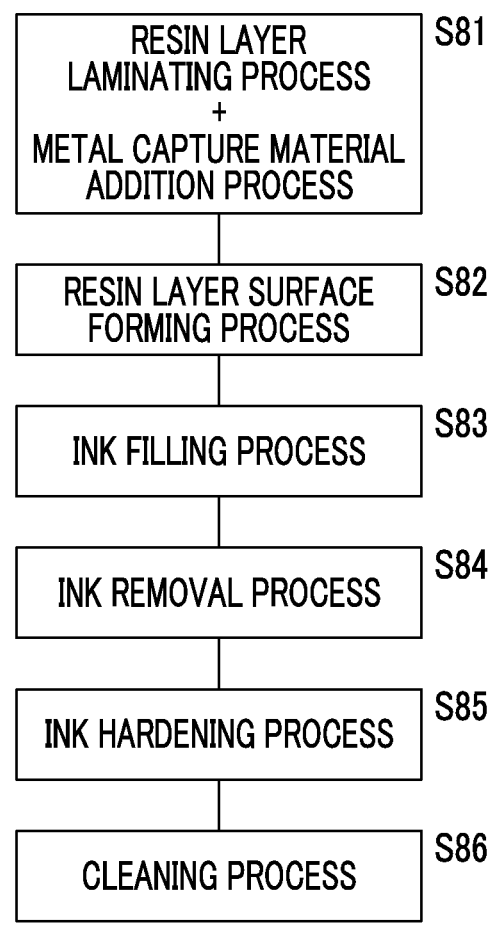
FIG. 8 is a flowchart illustrating a conductive film manufacturing process (1) according to the second embodiment.

FIG. 8 is a flowchart illustrating a conductive film manufacturing process (1) according to the second embodiment. Many parts of the manufacturing process (1) are the same as those of the manufacturing process according to the first embodiment. In the manufacturing process (1) illustrated in FIG. 8, the description of the same parts as those in the manufacturing process according to the first embodiment illustrated in FIG. 5 will not be repeated. The manufacturing process (1) according to the second embodiment differs from the manufacturing process according to the first embodiment in that a resin layer laminating process (Step S81) includes the metal capture material addition process. The conductive film manufacturing method (1) according to the second embodiment illustrated in FIG. 8 will be described with appropriate reference to FIG. 7.

First, a film is transported from the substrate feed unit 110 to the resin layer laminating unit 320. The resin layer laminating unit 320 performs a resin layer laminating process that laminates the resin layer 274 on the substrate 72 and the metal capture material addition process (Step S81). Specifically, the addition portion 324 adds the metal capture material to the ultraviolet-curable resin applied by the application portion 122 to form the resin layer 274' including the metal capture material on the substrate 72. In this stage, the resin layer 274' is not hardened.

The processes after the resin layer laminating process and the metal capture material addition process (Step S81), that is, the processes from the resin layer surface forming process (Step S82) to the cleaning process (Step S86) are substantially the same as the processes from the resin layer surface forming process (Step S52) to the cleaning process (Step S56) in the first embodiment illustrated in FIG. 5.

<Conductive Film Manufacturing Apparatus (2) According to Second Embodiment>

Figure 9:
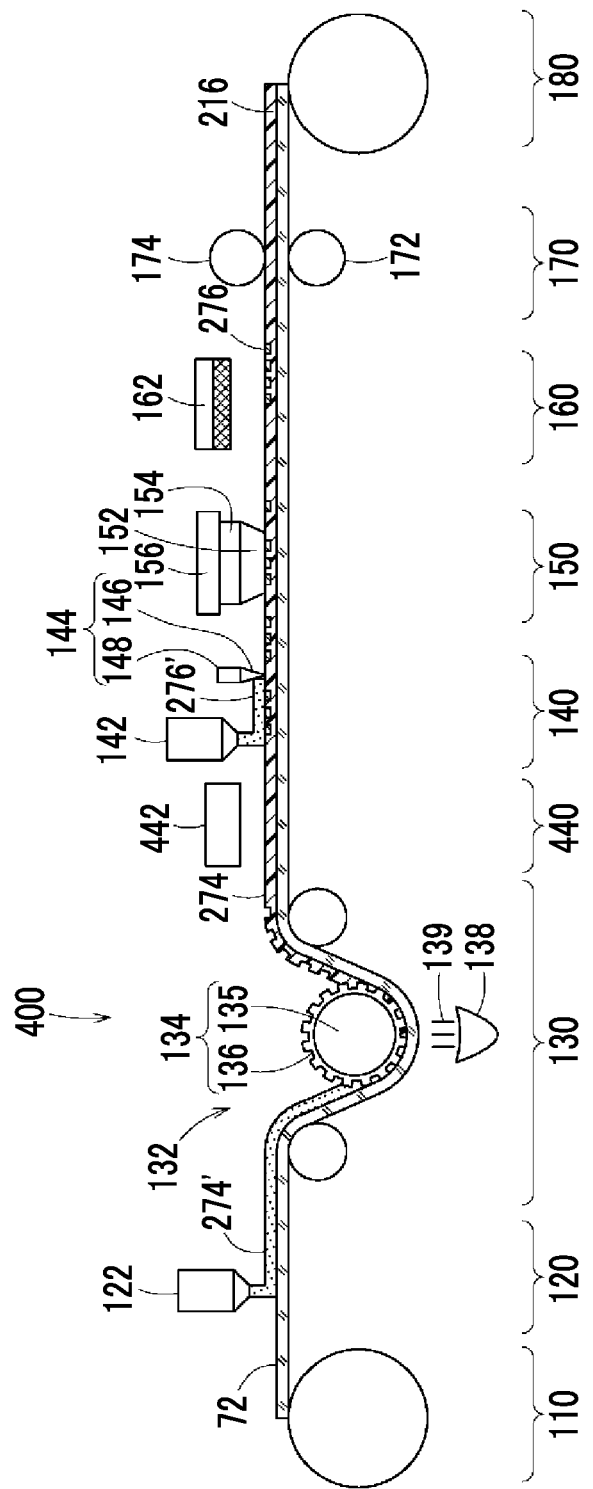
FIG. 9 is a diagram illustrating a conductive film manufacturing apparatus (2) according to the second embodiment.

FIG. 9 is a diagram illustrating a conductive film manufacturing apparatus (2) according to the second embodiment. Many parts of a conductive film manufacturing apparatus 400 are the same as those of the conductive film manufacturing apparatus 100 according to the first embodiment. In the conductive film manufacturing apparatus 400 illustrated in FIG. 9, the same parts as those in the conductive film manufacturing apparatus 100 according to the first embodiment illustrated in FIG. 3 are denoted by the same reference numerals and the description thereof will not be repeated. The conductive film manufacturing apparatus 400 differs from the conductive film manufacturing apparatus 100 in that it includes a metal capture material addition unit 440.

The metal capture material addition unit 440 is provided on the downstream side of the resin layer surface forming unit 130 in the film transport direction. The metal capture material addition unit 440 forms a metal capture material film on the surface of the resin layer 274 using a surface treatment device 442.

<Conductive Film Manufacturing Method (2) According to Second Embodiment>

Figure 10:
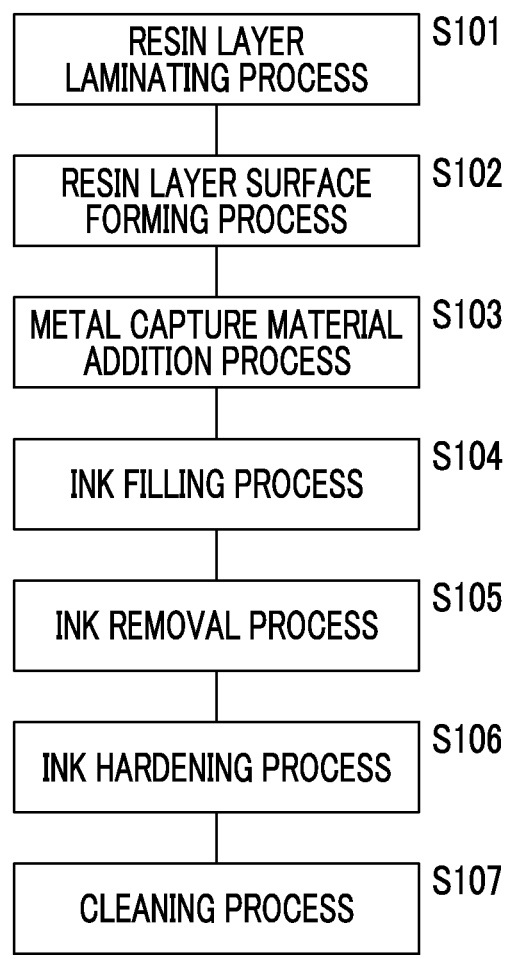
FIG. 10 is a flowchart illustrating a conductive film manufacturing process (2) according to the second embodiment.

FIG. 10 is a flowchart illustrating a conductive film manufacturing process (2) according to the second embodiment. Many parts of the manufacturing process (2) are the same as those of the manufacturing process according to the first embodiment. In the manufacturing process (2) illustrated in FIG. 10, the description of the same parts as those in the manufacturing process according to the first embodiment illustrated in FIG. 5 will not be repeated. The manufacturing process (2) according to the second embodiment differs from the manufacturing process according to the first embodiment in that a metal capture material addition process (Step S103) is added. The conductive film manufacturing method (2) according to the second embodiment illustrated in FIG. 10 will be described with appropriate reference to FIG. 9.

The processes from a resin layer laminating process (Step S101) to a resin layer surface forming process (Step S102) are substantially the same as the processes from the resin layer laminating process (Step S51) to the resin layer surface forming process (Step S52) in the first embodiment illustrated in FIG. 5.

When the resin layer surface forming process (Step S102) ends, the film is transported from the resin layer surface forming unit 130 to the metal capture material addition unit 440. The metal capture material addition unit 440 performs a metal capture material addition process (Step 103) that forms a metal capture material film on the surface of the resin layer 274, that is, the surface of the bank portion 274a and the bottom and side wall surface of the groove portion 274b.

The processes after the metal capture material addition process (Step S103), that is, the processes from an ink filling process (Step S104) to a cleaning process (Step S107) are substantially the same as the processes from the ink filling process (Step S53) to the cleaning process (Step S56) in the first embodiment illustrated in FIG. 5.

<Conductive Film Manufacturing Apparatus (3) According to Second Embodiment>

Figure 11:
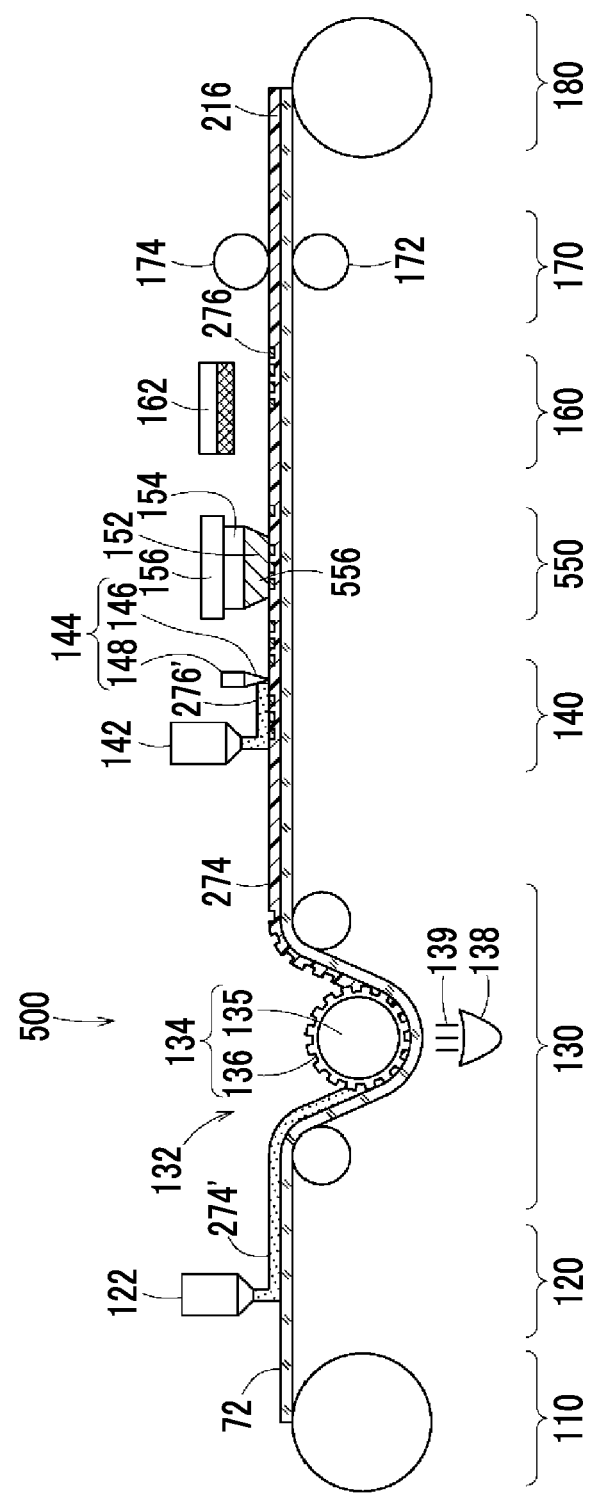
FIG. 11 is a diagram illustrating a conductive film manufacturing apparatus (3) according to the second embodiment.

FIG. 11 is a diagram illustrating a conductive film manufacturing apparatus (3) according to the second embodiment. Many parts of a conductive film manufacturing apparatus 500 are the same as those of the conductive film manufacturing apparatus 100 according to the first embodiment. In the conductive film manufacturing apparatus 500 illustrated in FIG. 11, the same parts as those in the conductive film manufacturing apparatus 100 according to the first embodiment illustrated in FIG. 3 are denoted by the same reference numerals and the description thereof will not be repeated. The conductive film manufacturing apparatus 500 differs from the conductive film manufacturing apparatus 100 in that it includes an ink removal unit 550.

The ink removal unit 550 is provided on the downstream side of the ink filling unit 140 in the film transport direction. The ink removal unit 550 includes a second squeegee blade 152 that removes ink 276' remaining on the bank portion 274a of the resin layer 274 and a second squeegee holder 154 that holds the second squeegee blade 152. An application member 556 is provided at the leading end of the second squeegee blade 152 which comes into contact with the resin layer 274. The application member 556 includes the metal capture material. For example, a solvent (IPA) in which 1 mass % of metal capture material is dissolved is infiltrated into cotton cloth and the cloth can be wound as the application member 556 around the second squeegee blade 152.

<Conductive Film Manufacturing Method (3) According to Second Embodiment>

Figure 12:
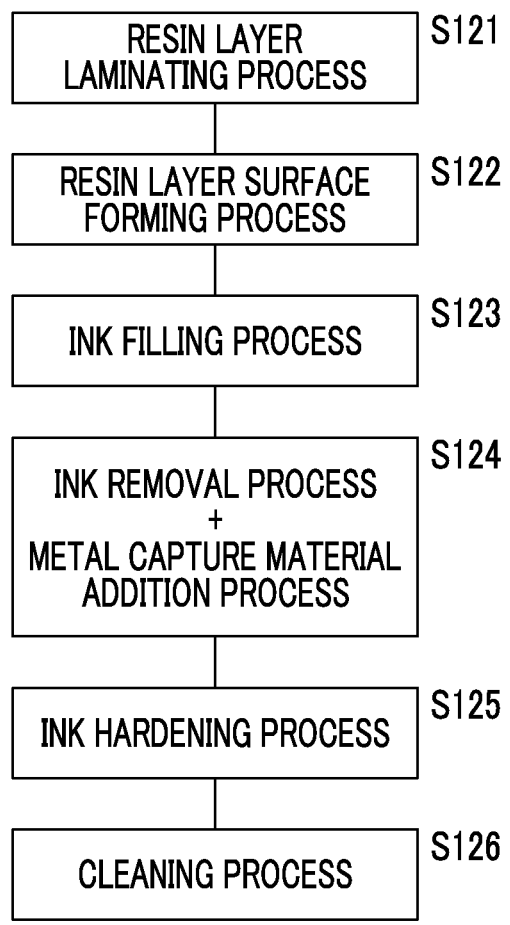
FIG. 12 is a flowchart illustrating a conductive film manufacturing process (3) according to the second embodiment.

FIG. 12 is a flowchart illustrating a conductive film manufacturing process (3) according to the second embodiment. Many parts of the manufacturing process (3) are the same as those of the manufacturing process according to the first embodiment. In the manufacturing process (3) illustrated in FIG. 12, the description of the same parts as those in the manufacturing process according to the first embodiment illustrated in FIG. 5 will not be repeated. The manufacturing process (3) according to the second embodiment differs from the manufacturing process according to the first embodiment in that an ink removal process (Step S124) includes the metal capture material addition process. The conductive film manufacturing method (3) according to the second embodiment illustrated in FIG. 12 will be described with appropriate reference to FIG. 11.

The processes from a resin layer laminating process (Step S121) to an ink filling process (Step S123) are substantially the same as the processes from the resin layer laminating process (Step S51) to the ink filling process (Step S53) in the first embodiment illustrated in FIG. 5.

When the ink filling process (Step S123) ends, the film is transported from the ink filling unit 140 to the ink removal unit 550. The ink removal unit 550 impregnates the application member 556 with a treatment liquid including the metal capture material and scrapes the surface of the resin layer 274 with the second squeegee blade 152. In this way, the ink removal process which removes the ink 276' from the surface of the resin layer 274 and the metal capture material addition process are performed. At the same time, a process which adds the metal capture material to the surface of the resin layer 274 and the ink 276' in the groove portion 274b is performed (Step S124).

The processes after the ink removal process and the metal capture material addition process (Step S124), that is, the processes from an ink hardening process (Step S125) to a cleaning process (Step S126) are substantially the same as the processes from the ink hardening process (Step S55) to the cleaning process (Step S56) in the first embodiment illustrated in FIG. 5.

<Conductive Film Manufacturing Apparatus (4) According to Second Embodiment>

Figure 13:
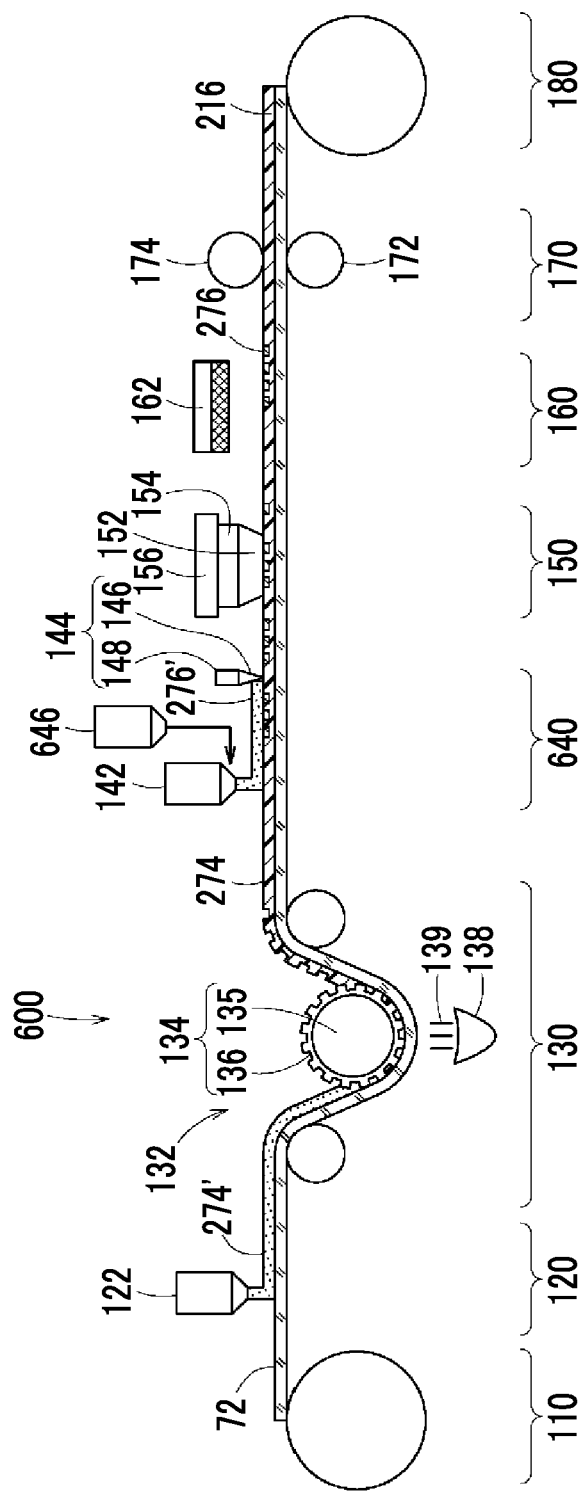
FIG. 13 is a diagram illustrating a conductive film manufacturing apparatus (4) according to the second embodiment.

FIG. 13 is a diagram illustrating a conductive film manufacturing apparatus (4) according to the second embodiment. Many parts of a conductive film manufacturing apparatus 600 are the same as those of the conductive film manufacturing apparatus 100 according to the first embodiment. In the conductive film manufacturing apparatus 600 illustrated in FIG. 13, the same parts as those in the conductive film manufacturing apparatus 100 according to the first embodiment illustrated in FIG. 3 are denoted by the same reference numerals and the description thereof will not be repeated. The conductive film manufacturing apparatus 600 differs from the conductive film manufacturing apparatus 100 in that it includes an ink filling unit 640.

The ink filling unit 640 is provided on the downstream side of the resin layer surface forming unit 130 in the film transport direction. The ink filling unit 640 comprises an addition portion 646, in addition to the ink supply portion 142 and the squeegee portion 144 of the ink filling unit 140 according to the first embodiment. The addition portion 646 adds the metal capture material to the ink 276' that is supplied from the ink supply portion 142 to the surface of the resin layer 274.

<Conductive Film Manufacturing Method (4) According to Second Embodiment>

Figure 14:
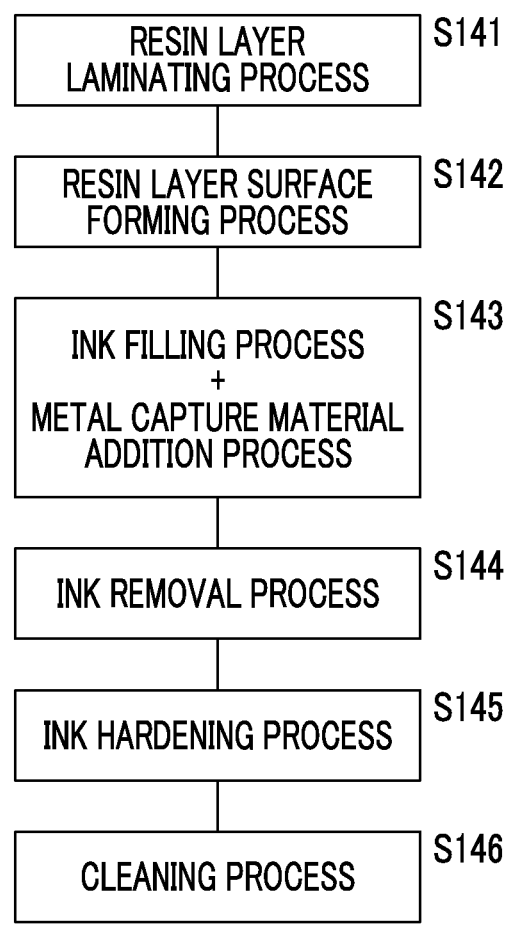
FIG. 14 is a flowchart illustrating a conductive film manufacturing process (4) according to the second embodiment.

FIG. 14 is a flowchart illustrating a conductive film manufacturing process (4) according to the second embodiment. Many parts of the manufacturing process (4) are the same as those of the manufacturing process according to the first embodiment. In the manufacturing process (4) illustrated in FIG. 14, the description of the same parts as those in the manufacturing process according to the first embodiment illustrated in FIG. 5 will not be repeated. The manufacturing process (4) according to the second embodiment differs from the manufacturing process according to the first embodiment in that an ink filling process (Step S143) includes the metal capture material addition process. The conductive film manufacturing method (4) according to the second embodiment illustrated in FIG. 14 will be described with appropriate reference to FIG. 13.

The processes from a resin layer laminating process (Step S141) to a resin layer surface forming process (Step S142) are substantially the same as the processes from the resin layer laminating process (Step S51) to the resin layer surface forming process (Step S52) in the first embodiment illustrated in FIG. 5.

When the resin layer surface forming process (Step S142) ends, the film is transported from the resin layer surface forming unit 130 to the ink filling unit 640. The ink filling unit 640 adds the metal capture material to the ink supplied from the ink supply portion 142 with the addition portion 646 to produce ink 276' including the metal capture material and supplies the ink 276' to the surface of the resin layer 274. Then, the first squeegee blade 146 is arranged on the downstream side of an ink supply position in the film transport direction such that the width direction of the leading end thereof is perpendicular to the film transport direction and the leading end comes into contact with the surface of the resin layer 274, strictly, the surface of the bank portion 274a with predetermined pressure. Then, with the transport of the film, the first squeegee blade 146 is moved relative to the resin layer 274 in a direction opposite to the film transport direction. In this way, the first squeegee blade 146 slides on the surface of the resin layer 274 to fill the groove portion 274b with the ink 276' while scraping the surface of the bank portion 274a to remove the ink 276' (Step S143).

The processes after the ink filling process and the metal capture material addition process (Step S143), that is, the processes from an ink removal process (Step S144) to a cleaning process (Step S146) are substantially the same as the processes from the ink removal process (Step S54) to the cleaning process (Step S56) in the first embodiment illustrated in FIG. 5.

As described above, according to the second embodiment, at least one of the resin layer or the thin metal wire includes the metal capture material. The metal particles that remain on the surface of the resin layer are captured by the metal capture material included in the resin layer or the thin metal wire. In the conductive film manufactured in this way, the metal capture material prevents the metal particles remaining on the surface of the resin layer from being diffused and arranged in a line to form a conductive path. Therefore, ion migration is less likely to occur and it is possible to reduce the anisotropy of the ion migration characteristics. An operation error is less likely to occur in a touch panel using the conductive film.

It is not necessary to align the direction in which the squeegee scrapes the surface of the resin layer in the four ink filling processes (Steps S83, S104, S123, and S143) illustrated in FIGS. 8, 10, 12, and 14 with the direction in which the squeegee scrapes the surface of the resin layer in the ink removal processes (Steps S84, S105, S124, and S144). However, when the directions are perpendicular to each other as in the first embodiment, ion migration is least likely to occur.

In addition, two or more of the resin layer laminating process (Step S81) in the manufacturing method (1) illustrated in FIG. 8, the metal capture material addition process (Step S103) in the manufacturing method (2) illustrated in FIG. 10, the ink removal process (Step S124) in the manufacturing method (3) illustrated in FIG. 12, and the ink filling process (Step S143) in the manufacturing method (4) illustrated in FIG. 14 may be appropriately combined with each other.

EXAMPLES

Next, the invention will be described in more detail with reference to examples of the invention. In addition, for example, materials, the amount of material used, a ration, the content of processes, and the procedure of processes described in the following examples can be appropriately changed, without departing from the scope and spirit of the invention. Therefore, the scope of the invention is not limitedly interpreted by the following examples.

FIG. 15 is a plan view illustrating a sample pattern for evaluating the electrode pattern according to the invention. The x direction and the y direction are perpendicular to each other. In order to evaluate the invention, the inventors manufactured a plurality of conductive films for evaluation in which the electrode pattern for evaluation illustrated in FIG. 15 was formed while changing conditions and evaluated the operation errors of each conductive film. The electrode patterns formed in the conductive films for evaluation are as follows.

Electrode pattern E1: The outward shape of the electrode pattern is a rectangle with a size of 15 mm×5 mm and has a long side parallel to the x direction and a short side parallel to the y direction.

Electrode pattern E2: The outward shape of the electrode pattern is a rectangle with a size of 5 mm×5 mm and has one side parallel to the x direction, another side that is perpendicular to the one side and is parallel to the y direction, and still another side that is on an extension line of one short side of the electrode pattern E1.

Electrode pattern E3: The outward shape of the electrode pattern is a rectangle with a size of 5 mm×5 mm and has one side parallel to the x direction, another side that is perpendicular to the one side and is parallel to the y direction, and two sides that are parallel to the extension lines of two long sides of the electrode pattern E1.

The gap between the electrode patterns E1 and E2 and the gap between the electrode patterns E1 and E3 are 10 μm.

The width of each of the electrode patterns E1, E2, and E3 is 5 μm and the pitch between cells included in the mesh-shaped pattern is 200 μm. In FIG. 15, the electrode patterns are designed such that a base point of the electrode pattern E1 is located on the upper right side, a base point of the electrode pattern E2 is located on the lower right side, a base point of the electrode pattern E3 is located on the upper left side, and the intersection points between the mesh-shaped patterns are located at the base points.

Each conductive film for evaluation was mainly manufactured by the following sequence. The ultraviolet-curable resin described in the specification was laminated on a PET substrate and groove patterns corresponding to the electrode patterns E1, E2, and E3 were formed in the surface of the resin layer, using the glass embossed sheet disclosed in US2007/034643A. After the resin layer was hardened, paste including silver particles was supplied to the surface of the resin layer and the squeegee blade was moved in the X direction or the Y direction to remove the silver particles remaining on the surface of the ultraviolet-curable resin while filling the groove pattern with the silver particles. Then, the squeegee blade was further moved in the X direction or the Y direction to remove the silver particles remaining on the surface of the ultraviolet-curable resin. Then, the paste was dried to form the electrode patterns E1, E2, and E3. The examples are different from each other in the following parts.

Example 1

Corresponding to First Embodiment

A substrate that was made of PET and had a thickness of 100 μm was used. A resin composition having the following composition was used as the ultraviolet-curable resin. First, as the resin layer laminating process, the following ultraviolet-curable resin composition was applied with a thickness of 30 μm (dried film thickness) on the PET substrate according to the process illustrated in FIG. 5. Then, as the resin layer surface forming process, an embossed sheet that was manufactured in advance was pressed against the ultraviolet-curable resin composition to form a groove portion with a width of 5 μm and a depth of 3 μm in the surface and was hardened by ultraviolet rays (see the electrode pattern illustrated in FIG. 15). Then, as the ink filling process, the groove portion was filled with REXALPHA (registered trademark) RF FS 015 (silver paste) manufactured by Toyo Ink Co., Ltd. Then, as the ink removal process, a removal member impregnated with ethanol was attached to the squeegee blade and ink remaining on the bank portion was removed. Finally, drying was performed at 80° C. for 3 minutes to harden the ink. In the ink filling process, the squeegee blade was moved in the x direction, that is, a direction parallel to the longitudinal direction of the electrode pattern E1. In the ink removal process, the squeegee blade was moved in the y direction, that is, a direction parallel to the lateral direction of the electrode pattern E1.

| <<Ultraviolet-curable Resin Composition>> | |
|---|---|
| Dipentaerythritol hexaacrylate | 70 parts by mass |
| Trimethylol propane triacrylate | 30 parts by mass |
| Photopolymerization initiator (IRGACURE (registered trademark) 184 (manufactured by Ciba Specialty Chemicals, Inc.)) | 4 parts by mass |
| Ethyl acetate | 150 parts by mass |
| Propylene glycol monomethyl ether | 150 parts by mass |

Example 2-1

Corresponding to First Embodiment+Second Embodiment (1)

In the resin layer laminating process according to Example 1, 1 mass % of 1,2,3-benzotriazole (metal capture material addition process) was added to an ultraviolet-curable resin composition. In addition, similarly to Example 1, the squeegee blade was moved in the direction parallel to the x direction during filling with ink and was moved in the direction parallel to the y direction during the removal of ink.

Example 2-2

Corresponding to First Embodiment+Second Embodiment (2)

Before the ink filling process according to Example 1, 0.1 mass % of 2-mercaptoimidazole was added to ethanol and a surface treatment was performed for the resin layer (metal capture material addition process). In addition, similarly to Example 1, the squeegee blade was moved in the direction parallel to the x direction during filling with ink and was moved in the direction parallel to the y direction during the removal of ink.

Example 2-3

Corresponding to First Embodiment+Second Embodiment (3)

In the ink removal process according to Example 1, a removal member in which 0.1 mass % of 1-phenyl-5-mercaptotetrazole was impregnated into ethanol was attached to the squeegee blade and an ink removal process was performed (metal capture material addition process). In addition, similarly to Example 1, the squeegee blade was moved in the direction parallel to the x direction during filling with ink and was moved in the direction parallel to the y direction during the removal of ink.

Example 2-4

Corresponding to First Embodiment+Second Embodiment (4)

In the ink filling process according to Example 1, 1 mass % of 1,2,3-benzotriazole was added to silver paste (metal capture material addition process). In addition, similarly to Example 1, the squeegee blade was moved in the direction parallel to the x direction during filling with ink and was moved in the direction parallel to the y direction during the removal of ink.

Example 3-1

Corresponding to Second Embodiment (1)

In the resin layer laminating process according to Example 1, 1 mass % of 1,2,3-benzotriazole was added to the ultraviolet-curable resin composition (metal capture material addition process). In addition, the squeegee blade was moved in the direction parallel to the x direction both during filling with ink and during the removal of ink.

Example 3-2

Corresponding to Second Embodiment (2)

Before the ink filling process according to Example 1, 0.1 mass % of 2-mercaptoimidazole was added to ethanol and a surface treatment was performed for the resin layer (metal capture material addition process). In addition, the squeegee blade was moved in the direction parallel to the x direction both during filling with ink and during the removal of ink.

Example 3-3

Corresponding to Second Embodiment (3)

In the ink removal process according to Example 1, a removal member in which 0.1 mass % of 1-phenyl-5-mercaptotetrazole was impregnated into ethanol was attached to the second squeegee blade and an ink removal process was performed (metal capture material addition process). In addition, the squeegee blade was moved in the direction parallel to the x direction both during filling with ink and during the removal of ink.

Example 3-4

Corresponding to Second Embodiment (4)

In the ink filling process according to Example 1, 1 mass % of 1,2,3-benzotriazole was added to silver paste. In addition, the squeegee blade was moved in the direction parallel to the x direction both during filling with ink and during the removal of ink.

Comparative Example 1-1

The squeegee blade was moved in the direction parallel to the x direction during the ink filling process and the ink removal process according to Example 1.

Comparative Example 1-2

The squeegee blade was moved in the direction parallel to the y direction during the ink filling process and the ink removal process according to Example 1.

A constant voltage of 3 V was applied to the conductive films manufactured in each example and each comparative example and a change in the resistance value between the electrode patterns E1 and E2 and a change in the resistance value between the electrode patterns E1 and E3 were observed. If the time (MS) when the resistance value between the electrode patterns E1 and E2 was less than 10 MΩ was 1, the relative time (ML) when the resistance value between the electrode patterns E1 and E3 was less than 10 MΩ was calculated. In addition, a migration ratio (MS/ML in a case in which ML≤1 was satisfied and ML/MS in a case in which ML>1 was satisfied) was calculated.

Touch panels were manufactured using the conductive films manufactured under the conditions of each example and each comparative example and an operation error rate was examined.

Figure 16:
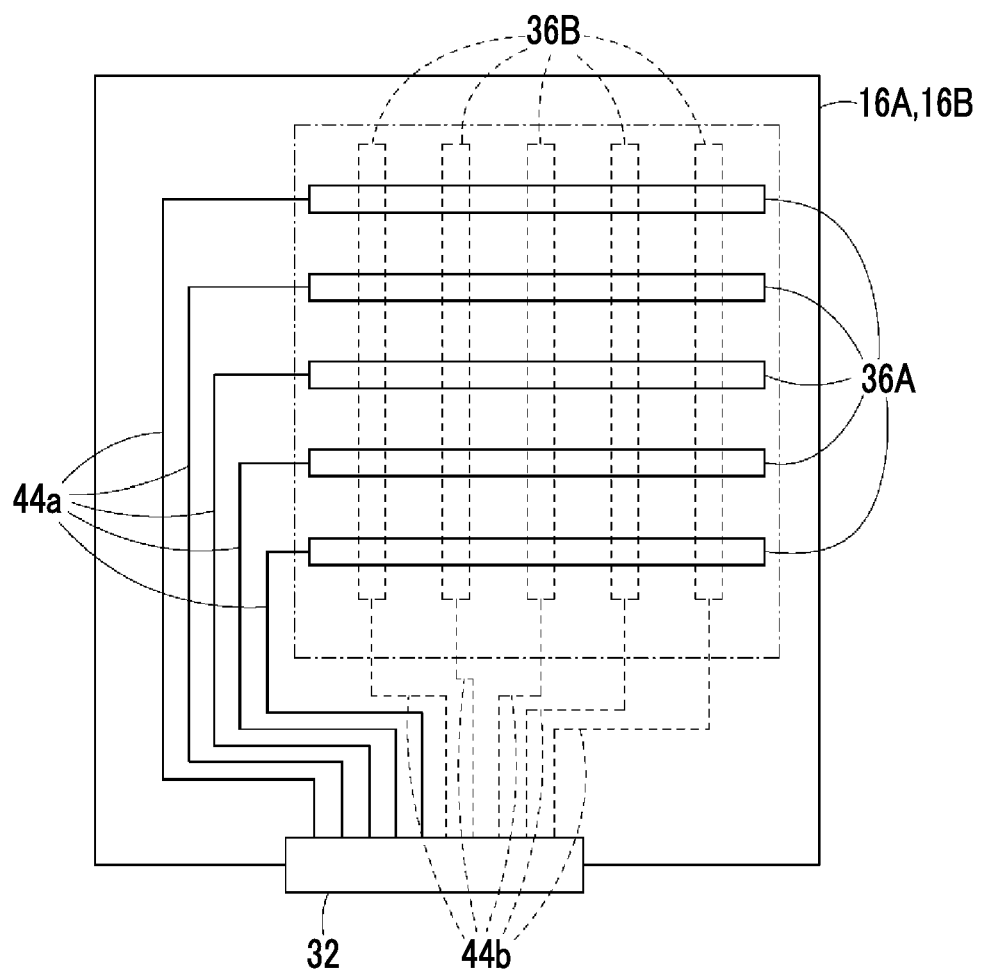
FIG. 16 is a diagram illustrating an electrode pattern of a test touch panel which is used to evaluate an operation error.

A conductive film which was manufactured by the same method as the conductive films according to each example and each comparative example was patterned to manufacture a test touch panel illustrated in FIG. 16. Two conductive films 16A and 16B manufactured by the same method as that in Example 1 were prepared. In the first conductive film 16A, a first electrode pattern 36A formed by mesh-shaped thin metal wires and a first terminal wiring portion 44a were patterned. In the first electrode pattern 36A, an electrode had a width of 10 mm and a length of 7.5 cm and the distance between adjacent electrodes was 5 mm. The electrode was used as an upper electrode. In the second conductive film 16B, a second electrode pattern 36B formed by mesh-shaped thin metal wires and a second terminal wiring portion 44b were patterned. Similarly to the first electrode pattern 36A, in the second electrode pattern 36B, an electrode had a width of 10 mm and a length of 7.5 cm and the distance between adjacent electrodes was 5 mm. The electrode was used as a lower electrode. Then, the first terminal wiring portion 44a of the first conductive film 16A and the second terminal wiring portion 44b of the second conductive film 16B were connected to a driving circuit 32. The two conductive films 16A and 16B were arranged such that the longitudinal directions of the electrode patterns 36A and 36B were perpendicular to each other and were bonded to each other by an OCA tape (8146) with a thickness of 100 μm manufactured by 3M (registered trademark) Company. Flexible printed circuits (FPC) were connected to terminal portions. In addition, a protective glass (thickness of 0.7 mm) was bonded to a contact surface by the OCA tape (8146) with a thickness of 100 μm manufactured by 3M (registered trademark) Company to manufacture a touch panel by way of trial. The manufactured touch panel was left in an environment of a temperature of 85° C., a humidity of 85%, and 500 hours. After the touch panel returned from a high-temperature and high-humidity to a room-temperature environment, 100 touch regions were randomly touched. In a case in which there was a difference between a touch position and a detection position and in a case in which the touch position was not detected, it was determined that an operation error occurred. Then, an operation error rate was calculated. At that time, the operation error was evaluated on the basis of the following criteria A, B, and C. The evaluation level B or higher is practicable.

A: The operation error rate is less than 1% and there is no operational problem.

B: The operation error rate is equal to or greater than 1% and less than 5% and the operation is possible.

C: The operation error rate is equal to or greater than 5% and there is an operational problem.

TABLE 1

|  | Extension direction of electrode pattern | Moving direction of squeegee in filling process | Moving direction of squeegee in removal process | MS | ML | MS/ML | Operation error evaluation |
| --- | --- | --- | --- | --- | --- | --- | --- |
| Example 1 | x direction | x direction | y direction | 1 | 0.75 | 1.33 | B |
| Example 2-1 | x direction | x direction | y direction | 1 | 0.85 | 1.18 | A |
| Example 2-2 | x direction | x direction | y direction | 1 | 0.9 | 1.11 | A |
| Example 2-3 | x direction | x direction | y direction | 1 | 0.9 | 1.11 | A |
| Example 2-4 | x direction | x direction | y direction | 1 | 0.83 | 1.20 | A |
| Example 3-1 | x direction | x direction | x direction | 1 | 0.78 | 1.28 | B |
| Example 3-2 | x direction | x direction | x direction | 1 | 0.81 | 1.23 | B |
| Example 3-3 | x direction | x direction | x direction | 1 | 0.82 | 1.22 | B |
| Example 3-4 | x direction | x direction | x direction | 1 | 0.75 | 1.33 | B |
| Comparative Example 1-1 | x direction | x direction | x direction | 1 | 0.7 | 1.43 | C |
| Comparative Example 1-2 | x direction | y direction | y direction | 1 | 1.46 | 0.68 | C |

As can be seen from Table 1, in a case in which the moving direction of the squeegee during filling with ink is perpendicular to the moving direction of the squeegee during the removal of ink and the metal capture material is used as in Example 1, an operation error is least likely to occur. In addition, in a case in which the moving direction of the squeegee during filling with ink is perpendicular to the moving direction of the squeegee during the removal of ink as in Examples 2-1 to 2-4 or in a case in which the metal capture material is used as in Examples 3-1 to 3-4, an operation error prevention effect can be expected.

<Method for Specifying Ion Migration Characteristics in General Conductive Film>

In general, the conductive films used in the touch panels have various electrode patterns and there is no pattern in which ML and MS can be simply compared with each other. Therefore, it is difficult to exactly compare ML and MS. The inventors measure the values as follows.

In a conductive film including a bank portion and a groove portion as in each embodiment described in the specification, ML and MS are measured for a region (hereinafter, referred to as a region A) in which no wire is formed and a resin layer is provided by the following operation.

First, a sample is manufactured by the following process. A protective substrate or a resin layer that covers the surface of the conductive film is removed such that the region A is exposed. For example, the conductive film is heated at a temperature of about 40° C. to remove a resin, such as an optical clear adhesive (OCA) covering the conductive film.

Figure 17:
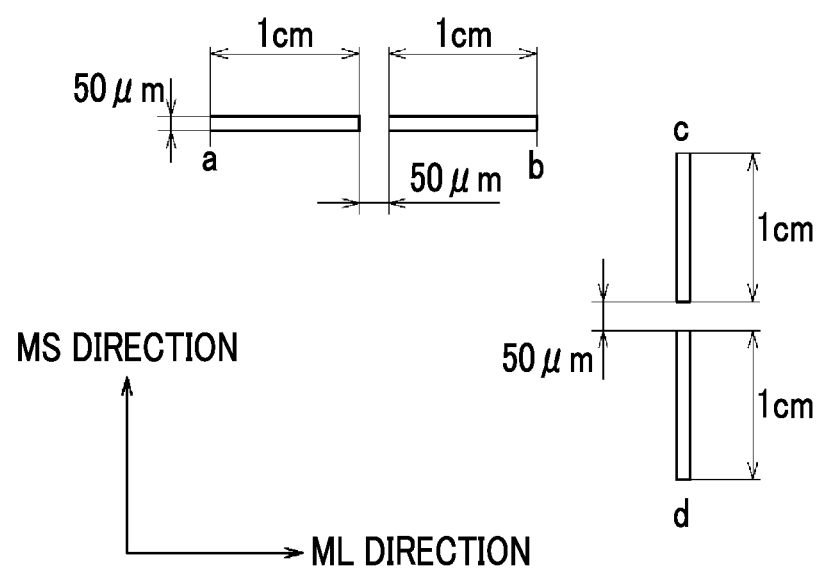
FIG. 17 is a diagram illustrating a sample which is used to specify the ion migration characteristics of a general conductive film.

A silver pattern illustrated in FIG. 17 is formed in the exposed region A by vacuum deposition. That is, two rectangular silver patterns having a length of 1 cm and a width of 50 μm are formed between a and b such that the longitudinal directions of the patterns are aligned with each other, the patterns are parallel to an ML direction, and the gap between the end portions is 50 μm as illustrated in FIG. 17. In addition, two rectangular silver patterns having a length of 1 cm and a width of 50 μm are formed between c and d such that the longitudinal directions of the patterns are aligned with each other, the patterns are parallel to an MS direction, and the gap between the end portions is 50 µm, as illustrated in FIG. 17. The thickness of silver is 100 nm. A metal mask having the same openings as the pattern illustrated in FIG. 17 adheres closely to the substrate and is used to form the pattern.

An OCA tape (8146) with a thickness of 100 µm manufactured by 3M (registered trademark) Company is attached in order to reduce the influence of an external environment.

The manufactured sample is placed in an environment of a temperature of 85° C. and a humidity of 85%. In a case in which the ion migration characteristics in the ML direction are measured, a voltage of 5 V is applied between a and b and the time when a resistance value is less than 1 MΩ is recorded. In a case in which the ion migration characteristics in the MS direction are measured, a voltage of 5 V is applied between c and d and the time when a resistance value is less than 1 MΩ is recorded. The recorded times are represented by ML and MS and a migration ratio ML/MS or MS/ML is calculated.

The conductive film, the conductive film manufacturing method, and the touch panel according to the invention are not limited to the above-described embodiments and various structures can be used without departing from the scope and spirit of the invention.

EXPLANATION OF REFERENCES 16, 216: conductive film
72: substrate
74, 274: resin layer
74a, 274a: bank portion
74b, 274b: groove portion
76, 276: thin metal wire
100, 300, 400, 500, 600: conductive film manufacturing apparatus
120, 320: resin layer laminating unit
130: resin layer surface forming unit
140, 640: ink filling unit
150, 550: ink removal unit
440: metal capture material addition unit

What is claimed is:

1. A conductive film comprising:
   a substrate;
   a resin layer that is laminated on the substrate and has a bank portion and a mesh-shaped groove portion formed in a surface on the resin layer; and
   a thin metal wire that is provided in the groove portion of the resin layer,
   wherein the thin metal wire forms an electrode pattern, and
   wherein a value indicating ion migration characteristics of the electrode pattern in a longitudinal direction is ML, a value indicating ion migration characteristics of the electrode pattern in a lateral direction is MS, and a migration ratio obtained by dividing the larger of the two values ML and MS by the smaller value is in the range of 1.0 to 1.4.

2. The conductive film according to claim 1, wherein the value ML is less than the value MS.

3. The conductive film according to claim 1, wherein the migration ratio is in the range of 1.0 to 1.2.

4. The conductive film according to claim 2, wherein the migration ratio is in the range of 1.0 to 1.2.

5. The conductive film according to claim 1, wherein the resin layer comprises a metal capture material.

6. The conductive film according to claim 2, wherein the resin layer comprises a metal capture material.

7. The conductive film according to claim 3, wherein the resin layer comprises a metal capture material.

8. The conductive film according to claim 4, wherein the resin layer comprises a metal capture material.

9. The conductive film according to claim 1, wherein the thin metal wire comprises the metal capture material.

10. The conductive film according to claim 5, wherein the metal capture material comprises at least one material selected from a group that consists of triazoles, imidazoles, tetrazoles, and triazaindolizines.

11. A conductive film manufacturing method of the conductive film according to claim 1, comprising:
    a resin layer laminating step of laminating the resin layer on the substrate;
    a resin layer surface forming step of forming the bank portion and the mesh-shaped groove portion in the surface of the resin layer;
    an ink filling step of supplying ink including metal particles to the surface of the resin layer and sliding an ink application member on the surface of the resin layer to fill the groove portion with the ink; and
    an ink removal step of sliding an ink removal member on the surface of the resin layer to remove the ink remaining on the bank portion,
    wherein a direction in which the ink application member slides in the ink filling step is different from a direction in which the ink removal member slides in the ink removal step.

12. The conductive film manufacturing method according to claim 11,
    wherein the direction in which the ink application member slides in the ink filling step is perpendicular to the direction in which the ink removal member slides in the ink removal step.

13. The conductive film manufacturing method according to claim 11,
    wherein the direction in which the ink application member slides in the ink filling step is parallel to a longitudinal direction of an electrode pattern.

14. A conductive film manufacturing method of the conductive film according to claim 1, comprising:
    a resin layer laminating step of laminating the resin layer on the substrate;
    a resin layer surface forming step of forming the bank portion and the mesh-shaped groove portion in the surface of the resin layer;
    an ink filling step of supplying ink including metal particles to the surface of the resin layer and sliding an ink application member on the surface of the resin layer to fill the groove portion with the ink;
    an ink removal step of sliding an ink removal member on the surface of the resin layer to remove the ink remaining on the bank portion; and
    a metal capture material addition step of adding a metal capture material.

15. The conductive film manufacturing method according to claim 14, wherein the metal capture material addition step has a step of adding the metal capture material to the resin layer as a part of the resin layer laminating step.

16. The conductive film manufacturing method according to claim 14,
wherein the metal capture material addition step is performed after the groove portion forming step, and
in the metal capture material addition step, the surface of the resin layer is treated by a treatment liquid comprising the metal capture material.

17. The conductive film manufacturing method according to claim 14,
wherein the metal capture material addition step is a part of the ink removal step, and
in the metal capture material addition step, the ink removal member that is impregnated with a treatment liquid comprising the metal capture material is used.

18. The conductive film manufacturing method according to claim 14,
wherein the metal capture material addition step is a part of the ink filling step, and
in the metal capture material addition step, the metal capture material is added to the ink.

19. The conductive film manufacturing method according to claim 15,
wherein the metal capture material comprises at least one material selected from a group that consists of triazoles, imidazoles, tetrazoles, and triazaindolizines.

20. A touch panel comprising:
the conductive film according to claim 1.

* * * * *